US011148621B2

(12) United States Patent
Dunn et al.

(10) Patent No.: US 11,148,621 B2
(45) Date of Patent: Oct. 19, 2021

(54) ELECTRONIC DISPLAY ASSEMBLIES WITH SOLAR PANELS

(71) Applicant: Manufacturing Resources International, Inc., Alpharetta, GA (US)

(72) Inventors: William Dunn, Alpharetta, GA (US); Gerald Fraschilla, Snellville, GA (US); Jack Bartholmae, Duluth, GA (US); Douglas Bennett, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 17/001,916

(22) Filed: Aug. 25, 2020

(65) Prior Publication Data
US 2021/0066923 A1    Mar. 4, 2021

Related U.S. Application Data

(60) Provisional application No. 62/911,806, filed on Oct. 7, 2019, provisional application No. 62/892,104, filed on Aug. 27, 2019.

(51) Int. Cl.
*B60R 16/033* (2006.01)
*H05K 5/00* (2006.01)
(Continued)

(52) U.S. Cl.
CPC .............. *B60R 16/033* (2013.01); *B60K 6/24* (2013.01); *B60K 6/26* (2013.01); *B60K 6/28* (2013.01);
(Continued)

(58) Field of Classification Search
CPC ....... B60R 6/033; B60R 9/04; B60R 11/0229; B60R 13/00; H02S 10/40; H02S 20/10;
(Continued)

(56) References Cited

U.S. PATENT DOCUMENTS

| 3,525,461 A | 8/1970 | Bronson |
| D222,989 S | 2/1972 | Cohen |

(Continued)

FOREIGN PATENT DOCUMENTS

| AU | 201815719 | 10/2018 |
| AU | 201815720 | 10/2018 |

(Continued)

OTHER PUBLICATIONS

Adnation, Miller photos, May 9, 2017, 28 pages.
(Continued)

*Primary Examiner* — Robert L Deberadinis
(74) *Attorney, Agent, or Firm* — Standley Law Group LLP; Jeffrey S. Standley; Adam J. Smith

(57) ABSTRACT

A solar powered display assembly and systems and methods for the same are provided. A solar energy harvesting device is electrically connected to a display unit which is connected to an electrical grid. At least one structural member extends between a housing for the display unit and the solar energy harvesting device such that a bottom surface of the solar energy harvesting device is elevated above, and spaced apart from, a top surface of the housing such that shade is periodically cast on the display unit. The solar energy harvesting device has a first footprint, and the housing has a second footprint which is smaller than the first footprint.

26 Claims, 24 Drawing Sheets

(51) Int. Cl.
| | |
|---|---|
| *H05K 7/20* | (2006.01) |
| *B60R 13/00* | (2006.01) |
| *H02J 7/00* | (2006.01) |
| *H02S 10/40* | (2014.01) |
| *H02S 30/10* | (2014.01) |
| *H02S 40/38* | (2014.01) |
| *H02J 7/35* | (2006.01) |
| *B60L 58/10* | (2019.01) |
| *B60K 6/24* | (2007.10) |
| *B60K 6/26* | (2007.10) |
| *B60K 6/28* | (2007.10) |
| *B60R 9/04* | (2006.01) |
| *B60R 11/02* | (2006.01) |
| *G09F 21/04* | (2006.01) |
| *H02S 20/10* | (2014.01) |
| *E04H 1/12* | (2006.01) |
| *G09F 19/22* | (2006.01) |
| *H02J 3/38* | (2006.01) |
| *G09F 9/33* | (2006.01) |
| *G09F 9/35* | (2006.01) |

(52) U.S. Cl.
CPC ........... *B60L 58/10* (2019.02); *B60R 9/04* (2013.01); *B60R 11/0229* (2013.01); *B60R 13/00* (2013.01); *E04H 1/1211* (2013.01); *G09F 19/22* (2013.01); *G09F 21/04* (2013.01); *H02J 3/381* (2013.01); *H02J 7/0068* (2013.01); *H02J 7/35* (2013.01); *H02S 10/40* (2014.12); *H02S 20/10* (2014.12); *H02S 30/10* (2014.12); *H02S 40/38* (2014.12); *H05K 5/0017* (2013.01); *H05K 7/202* (2013.01); *H05K 7/20172* (2013.01); *H05K 7/20954* (2013.01); *H05K 7/20972* (2013.01); *B60Y 2300/91* (2013.01); *B60Y 2400/112* (2013.01); *B60Y 2400/43* (2013.01); *B60Y 2400/60* (2013.01); *G09F 9/33* (2013.01); *G09F 9/35* (2013.01); *H02J 2300/24* (2020.01)

(58) Field of Classification Search
CPC .......... H02S 30/10; H02S 40/38; B60L 58/10; B60K 6/24; B60K 6/26; B60K 6/28; E04H 1/1211; H05K 5/0017; H05K 7/20172; H05K 7/202; H05K 7/20954; H05K 7/20972; H02J 2300/24; H02J 3/381; H02J 7/0068; H02J 7/35; B60Y 2300/91; B60Y 2400/112; B60Y 2400/43; B60Y 2400/60; G09F 9/33; G09F 9/35; G09F 19/22; G09F 21/04
See application file for complete search history.

(56) References Cited

U.S. PATENT DOCUMENTS

| | | | |
|---|---|---|---|
| 3,978,599 A | 9/1976 | Berger | |
| 4,052,806 A | 10/1977 | George | |
| 4,114,789 A | 9/1978 | Blaylock et al. | |
| 4,449,656 A | 5/1984 | Wouden | |
| 4,500,020 A | 2/1985 | Rasor | |
| 4,534,496 A | 8/1985 | Bott | |
| 4,640,450 A | 2/1987 | Gallion et al. | |
| 4,671,004 A | 6/1987 | Berg | |
| D294,137 S | 2/1988 | Robson | |
| D296,087 S | 6/1988 | Luck | |
| 4,768,691 A | 9/1988 | Stapleton | |
| 4,778,092 A | 10/1988 | Grace | |
| D306,990 S | 4/1990 | Bott | |
| 4,972,983 A | 11/1990 | Bott | |
| 4,982,886 A | 1/1991 | Cucheran | |
| D314,983 S | 2/1991 | Cangianni et al. | |
| 4,993,615 A | 2/1991 | Arvidsson | |
| 5,016,798 A | 5/1991 | Stapleton et al. | |
| 5,038,988 A | 8/1991 | Thulin | |
| D320,971 S | 10/1991 | Sparham et al. | |
| 5,104,020 A | 4/1992 | Arvidsson et al. | |
| D326,282 S | 5/1992 | Spoljaric | |
| 5,132,666 A | 7/1992 | Fahs | |
| 5,170,920 A | 12/1992 | Corrente et al. | |
| 5,171,083 A | 12/1992 | Rich | |
| 5,207,365 A | 5/1993 | Bott | |
| 5,306,156 A | 4/1994 | Gibbs et al. | |
| 5,347,736 A | 9/1994 | Kanigan | |
| 5,385,285 A | 1/1995 | Cucheran et al. | |
| 5,474,218 A | 12/1995 | Arsenault, Jr. et al. | |
| 5,560,525 A | 10/1996 | Grohmann et al. | |
| D398,409 S | 9/1998 | Jessa | |
| 5,826,766 A | 10/1998 | Aftanas | |
| D403,434 S | 12/1998 | Sander | |
| 5,845,828 A | 12/1998 | Settelmayer | |
| 5,871,190 A | 2/1999 | Henriksson | |
| D410,751 S | 6/1999 | Meier | |
| 5,979,723 A | 11/1999 | Tress et al. | |
| 6,050,467 A | 4/2000 | Drouillard et al. | |
| D430,901 S | 9/2000 | Palmer | |
| 6,116,486 A | 9/2000 | Lindell | |
| D453,194 S | 1/2002 | Gentelia et al. | |
| 6,378,747 B1 | 4/2002 | Fisch et al. | |
| 6,415,970 B1 | 7/2002 | Kmita et al. | |
| D486,188 S | 2/2004 | Norcross et al. | |
| 6,701,143 B1 | 3/2004 | Dukach et al. | |
| 6,812,851 B1 | 11/2004 | Dukach et al. | |
| D500,143 S | 12/2004 | Moncho et al. | |
| 6,850,209 B2 | 2/2005 | Mankins et al. | |
| D530,432 S | 10/2006 | Gottesdiener | |
| 7,134,764 B1 | 11/2006 | Bieberdorf | |
| D535,034 S | 1/2007 | Gottesdiener | |
| 7,434,713 B2 | 10/2008 | Linden | |
| D593,213 S | 5/2009 | Grimshaw et al. | |
| D603,973 S | 11/2009 | Jackson et al. | |
| D634,722 S | 3/2011 | Kim et al. | |
| D635,614 S | 4/2011 | Yan | |
| D639,340 S | 6/2011 | Martin | |
| D647,970 S | 11/2011 | Strempack | |
| D654,116 S | 2/2012 | McDougall et al. | |
| 8,122,628 B2 | 2/2012 | Johnson, Jr. | |
| D657,421 S | 4/2012 | Yan | |
| D657,422 S | 4/2012 | Yan | |
| D659,259 S | 5/2012 | Duddy | |
| D669,938 S | 10/2012 | Lard et al. | |
| D704,265 S | 5/2014 | Yan | |
| 9,121,391 B1 | 9/2015 | Koehler, III | |
| 9,135,839 B2 | 9/2015 | Remenda | |
| D740,472 S | 10/2015 | Linton et al. | |
| D740,966 S | 10/2015 | Indio da Costa et al. | |
| D747,816 S | 1/2016 | Indio da Costa et al. | |
| D763,357 S | 8/2016 | Tsuru et al. | |
| D765,660 S | 9/2016 | Kim et al. | |
| D775,989 S | 1/2017 | Kalanick et al. | |
| D777,258 S | 1/2017 | Strempack et al. | |
| D786,453 S | 5/2017 | Indio da Costa et al. | |
| D786,454 S | 5/2017 | Indio da Costa et al. | |
| D793,890 S | 8/2017 | Hong | |
| D795,453 S | 8/2017 | Indio da Costa et al. | |
| D804,054 S | 11/2017 | Indio da Costa et al. | |
| D806,895 S | 1/2018 | Terashima et al. | |
| D815,690 S | 4/2018 | Squillante | |
| 9,994,160 B2 | 6/2018 | Kim et al. | |
| D839,352 S | 1/2019 | Lim et al. | |
| D848,528 S | 5/2019 | Lee et al. | |
| D848,529 S | 5/2019 | Lee et al. | |
| 10,326,962 B2 | 6/2019 | Hamilton | |
| D856,530 S | 8/2019 | Oskoui | |
| 10,486,618 B2 | 11/2019 | Hornsby et al. | |
| D869,378 S | 12/2019 | Hornsby et al. | |
| D878,467 S | 3/2020 | Hornsby et al. | |
| D879,202 S | 3/2020 | Hornsby et al. | |
| 10,827,657 B2 | 11/2020 | Lee | |
| 2002/0009978 A1 | 1/2002 | Dukach et al. | |

(56) References Cited

U.S. PATENT DOCUMENTS

| | | |
|---|---|---|
| 2002/0065046 A1 | 5/2002 | Mankins et al. |
| 2002/0084891 A1 | 7/2002 | Mankins et al. |
| 2002/0112026 A1 | 8/2002 | Fridman et al. |
| 2002/0164962 A1 | 11/2002 | Mankins et al. |
| 2003/0119448 A1 | 6/2003 | Arntz |
| 2004/0004827 A1 | 1/2004 | Guest |
| 2004/0036622 A1 | 2/2004 | Dukach et al. |
| 2004/0170013 A1 | 9/2004 | Smythe |
| 2004/0182898 A1 | 9/2004 | Harris |
| 2005/0116511 A1 | 6/2005 | Leroy et al. |
| 2006/0091170 A1 | 5/2006 | Almhil |
| 2007/0108243 A1 | 5/2007 | Bingham |
| 2007/0158965 A1 | 7/2007 | Van Smirren |
| 2008/0236007 A1 | 10/2008 | Au et al. |
| 2010/0079979 A1 | 4/2010 | Nakamichi et al. |
| 2010/0282799 A1 | 11/2010 | Hubbard |
| 2011/0072697 A1 | 3/2011 | Miller |
| 2011/0075363 A1 | 3/2011 | Nakamichi et al. |
| 2011/0132946 A1 | 6/2011 | Sautter et al. |
| 2011/0298841 A1 | 12/2011 | Fujimori |
| 2011/0315726 A1 | 12/2011 | Huhn et al. |
| 2012/0002357 A1 | 1/2012 | Auld et al. |
| 2012/0131936 A1 | 5/2012 | Yoshida et al. |
| 2012/0224116 A1 | 9/2012 | Barnes |
| 2012/0312848 A1 | 12/2012 | Delusky et al. |
| 2013/0173358 A1 | 7/2013 | Pinkus |
| 2015/0129625 A1 | 5/2015 | Gorey et al. |
| 2015/0175082 A1 | 6/2015 | Aftanas et al. |
| 2015/0232038 A1 | 8/2015 | Robertson |
| 2015/0274084 A1 | 10/2015 | Sargès et al. |
| 2015/0369274 A1 | 12/2015 | Stojkovic et al. |
| 2015/0381922 A1 | 12/2015 | Hamilton |
| 2016/0041423 A1 | 2/2016 | Dunn |
| 2017/0029043 A1 | 2/2017 | Clark et al. |
| 2017/0050576 A1 | 2/2017 | Ferman |
| 2017/0132960 A1 | 5/2017 | Kis-Benedek Pinero et al. |
| 2017/0257978 A1 | 9/2017 | Diaz |
| 2018/0170270 A1 | 6/2018 | Bergman |
| 2018/0272959 A1 | 9/2018 | Hornsby et al. |
| 2018/0293921 A1 | 10/2018 | Margrill |
| 2018/0345809 A1 | 12/2018 | Derrien et al. |
| 2019/0295386 A1 | 9/2019 | Roberts |
| 2020/0010025 A1 | 1/2020 | Hornsby et al. |
| 2020/0039450 A1 | 2/2020 | Homsby et al. |
| 2020/0207284 A1 | 7/2020 | Hornsby et al. |

FOREIGN PATENT DOCUMENTS

| | | |
|---|---|---|
| AU | 201815721 | 10/2018 |
| CA | 183485 | 12/2019 |
| CA | 183486 | 12/2019 |
| CA | 183487 | 12/2019 |
| CN | 106782121 A | 5/2017 |
| CN | 109961695 A | 7/2019 |
| DE | 202007017477 U1 | 6/2008 |
| EM | 005638509-0001 | 9/2018 |
| EM | 005638541-0001 | 9/2018 |
| EM | 005638558-0001 | 9/2018 |
| EM | 008035232-0001 | 7/2020 |
| EP | 0476288 A1 | 3/1992 |
| EP | 3040766 A1 | 7/2016 |
| EP | 3602534 A1 | 2/2020 |
| JP | 2012-16086 A | 1/2012 |
| JP | 2012-255847 A | 12/2012 |
| JP | 1634158 S | 5/2019 |
| JP | 1634159 S | 5/2019 |
| JP | 1660382 S | 5/2020 |
| KR | 300422537.00000 | 8/2006 |
| KR | 10-0917344 B1 | 9/2009 |
| KR | 10-1444022 B1 | 10/2014 |
| KR | 30-1045258 | 2/2020 |
| KR | 30-1045259 | 2/2020 |
| KR | 30-1045260 | 2/2020 |
| WO | 2016/102980 A1 | 6/2016 |
| WO | D098725-001 | 12/2017 |
| WO | 2018/175888 A1 | 9/2018 |

OTHER PUBLICATIONS

LG-MRI, BoldVu Vehicle Top Displays, via Internet Archive Wayback Machine at URL: https://web.archive.org/web/20190327001140/https://lg-mri.com/digital-taxi-top-display/, Mar. 27, 2019, 8 pages.
Mcgarrybowen, Inside the Campaign: United Airlines "Real Time Taxi", https://www.aaaa.org/inside-campaign-united-airlines-real-time-taxi-mcgarrybowen-media-partners-kinetic-mec-verifone/, Jul. 7, 2017, 6 pages, American Association of Advertising Agencies.
Rave, DSE 2017: LG-MRI Presents TaxiVu, a Digital LCD Display for Mobile Advertising, video at https://www.youtube.com/watch?v=CmNw40BT6ZE, Mar. 30, 2017, 1 page.
Rave, DSE 2018: LG-MRI Highlights BoldVu Vehicle Top Display, VT1145LD, for DOOH Advertising, video at https://www.youtube.com/watch?v=IYSMhCnMyhg, Apr. 1, 2018, 1 page.
Adnation, Turn Key Solutions, May 23, 2017, 4 pages.
Gizmodo, Uber Will Puts Ads on Top of Vehicles Just Like Old-School Taxis, Feb. 24, 2020, 4 pages.
The Street, Lyft Acquires Halo Cars, a Startup That Places Ads on Vehicles, Feb. 21, 2020, 2 pages.
Marketingdive, Puma brings targeted hologram ads to car roofs for NBA All-Star game, Feb. 20, 2020, 3 pages.
Deploy Solution, Melford Technologies homepage, Mar. 3, 2020, 4 pages.
Commercial Integrator, WaiveCar Brings Car Sharing and Digital Signage Together with Help from BrightSign, Jul. 6, 2018, 9 pages.
Vertical Digital Displays, Innovation on Display FlexVu Totem Brochure, 2014, 6 pages.
Vertigo Digital Displays, FlexVu Totem Shelter, 2017, 2 pages.
Vertical Digital Displays, All Products Cataogue, 2017, 14 pages.
CIVIQ Smartscapes, FlexVue Ferro 55P/55L, Mar. 16, 2017, 4 pages.
CIVIQ Smartscapes, There are companies that make kiosks. And then there's CIVIQ.—Advanced Smart City Platform, webpage, Jan. 30, 2019, 10 pages.
CIVIQ Smartscapes, Connecting people, places & experiences, webpage, Jan. 30, 2019, 5 pages.
CIVIQ Smartscapes, Connecting people, places & experiences, screen shot of devices webpage, Jan. 30, 2019, 1 page.
Manufacturing Resources International, Manufacturing Resources International home webpage, Nov. 4, 2019, 2 pages.
Manufacturing Resources International, LCD Display Deployments webpage, Nov. 4, 2019, 3 pages.
Manufacturing Resources International, BoldVu Outdoor LCD Display webpage, Nov. 4, 2019, 2 pages.
Manufacturing Resources International, BoldVu Semi Outdoor LCD Display webpage, Nov. 8, 2019, 2 pages.
Manufacturing Resources International, BoldVu Vehicle Top LCD Display webpage, Nov. 8, 2019, 2 pages.
Manufacturing Resources International, Drivethru Menu Boards Webpage, Nov. 8, 2019, 2 pages.
Manufacturing Resources International, Storefront Digital Signage webpage, Nov. 8, 2019, 2 pages.
Melford Technologies, Part 1, video online at https://m.youtube.com/watch?v=OAV7zzVrHtE&feature=youtu.be, Oct. 21, 2019, 1 page.
Gable, Blog Post: The Anatomy of an Interactive Kiosk, Aug. 15, 2018, 4 pages.

ELECTRONIC DISPLAY ASSEMBLIES WITH SOLAR PANELS

CROSS-REFERENCE TO RELATED APPLICATIONS

This application claims the benefit of U.S. Provisional Application No. 62/892,104 filed on Aug. 27, 2019 and U.S. Provisional Application No. 62/911,806 filed Oct. 7, 2019, the disclosures of each of which are hereby incorporated by reference as if fully restated herein.

TECHNICAL FIELD

Exemplary embodiments relate generally to electronic display assemblies, particularly those for outdoor use, with solar panels.

BACKGROUND AND SUMMARY OF THE INVENTION

Electronic displays are increasingly replacing physical billboards, bulletins, posters, flyers, banners, and other physical signage for public announcements, advertising, and the like. Such physical signage is commonly provided along sidewalks, along roadsides, at bus shelters, on poles, at drive throughs, on vehicle toppers, and the like. Ruggedized displays have also been provided for indoor, outdoor, and semi-outdoor use. Such displays may protect the electronic displays and related components from the elements, vandalism, theft, and the like, and may be configured to display public announcements, advertising, and the like. Examples of such displays include those available from Manufacturing Resources International, Inc. of Alpharetta, Ga. (https://mri-inc.net/). These displays may be provided on sidewalks, on the ground, in windows, at bus shelters, at drive throughs, on the tops of vehicles, and the like to replace physical signage.

Advancements in solar energy technology have made solar panels more compact and efficient. Displays require power for operation. For example, such displays may utilize lights, electronic displays, fans and other cooling equipment, electrical circuitry and other electrically powered equipment which requires electrical power for operation. Generally, such power is provided by the electrical grid, but increasing public interest in the use of alternative energy source (e.g., solar panels) creates a desire for displays which do not draw power from the electrical grid, or at least not as much.

An electronic display assembly with one or more solar panels is provided. The electronic display assembly may be configured for outdoor use. For example, without limitation, the electronic display assembly may be configured for mounting to a sidewalk, to a bus shelter, to the ground, at a drive through canopy, to a pole, or the like. The electronic display assembly may be integrated with various street furniture including, but not limited to, a bus shelter, a bench, a wall, a light pole, a drive through canopy, some combination thereof, or the like. Each electronic display assembly may comprise one or more display units. Any number, type, size, and orientation of such display units may be utilized.

One or more supports may extend between the electronic display assembly and one or more solar energy harvesting devices such that the one or more solar energy harvesting devices are elevated above a housing for the electronic display assembly. This may provide the clearance needed for the performance of maintenance efforts on the electronic display assembly.

The elevation of the one or more solar energy harvesting devices may also cast shade on various components of the electronic display assembly, such as but not limited to, the display units. This may improve the contrast of images displayed on the electronic display, and may lower brightness requirements. Doing so may reduce the solar load experienced by the electronic display assembly. Together or separately, these improvements may also reduce thermal management demands. In exemplary embodiments, the one or more solar energy harvesting devices may be longer and/or wider than the electronic display assembly to provide such shade. This may also increase the available area for solar power. Any number, size, type, location, and orientation of such solar energy harvesting devices may be utilized.

The display units may be configured to directly accept both AC and DC power. Power generated by the solar energy harvesting devices may be used to directly power the display units when conditions are sufficiently sunny, and may be directly supplied to the display units in DC form. When the power generated by the one or more solar energy harvesting devices is insufficient to power the electronic display assemblies, only the additional energy required may be drawn from the electrical grid, one or more energy storage devices, some combination thereof, and/or the like. This power may be directly supplied to the display units in AC form. During daytime hours, the power consumption of the electronic display assemblies is typically relatively high because more brightness is needed to provide adequate viewing conditions. During nighttime hours, the power consumption of the electronic display assemblies is typically relatively low because less brightness is needed to provide adequate viewing conditions. The use of such solar energy harvesting devices may reduce the environmental impact of such electronic display assemblies.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
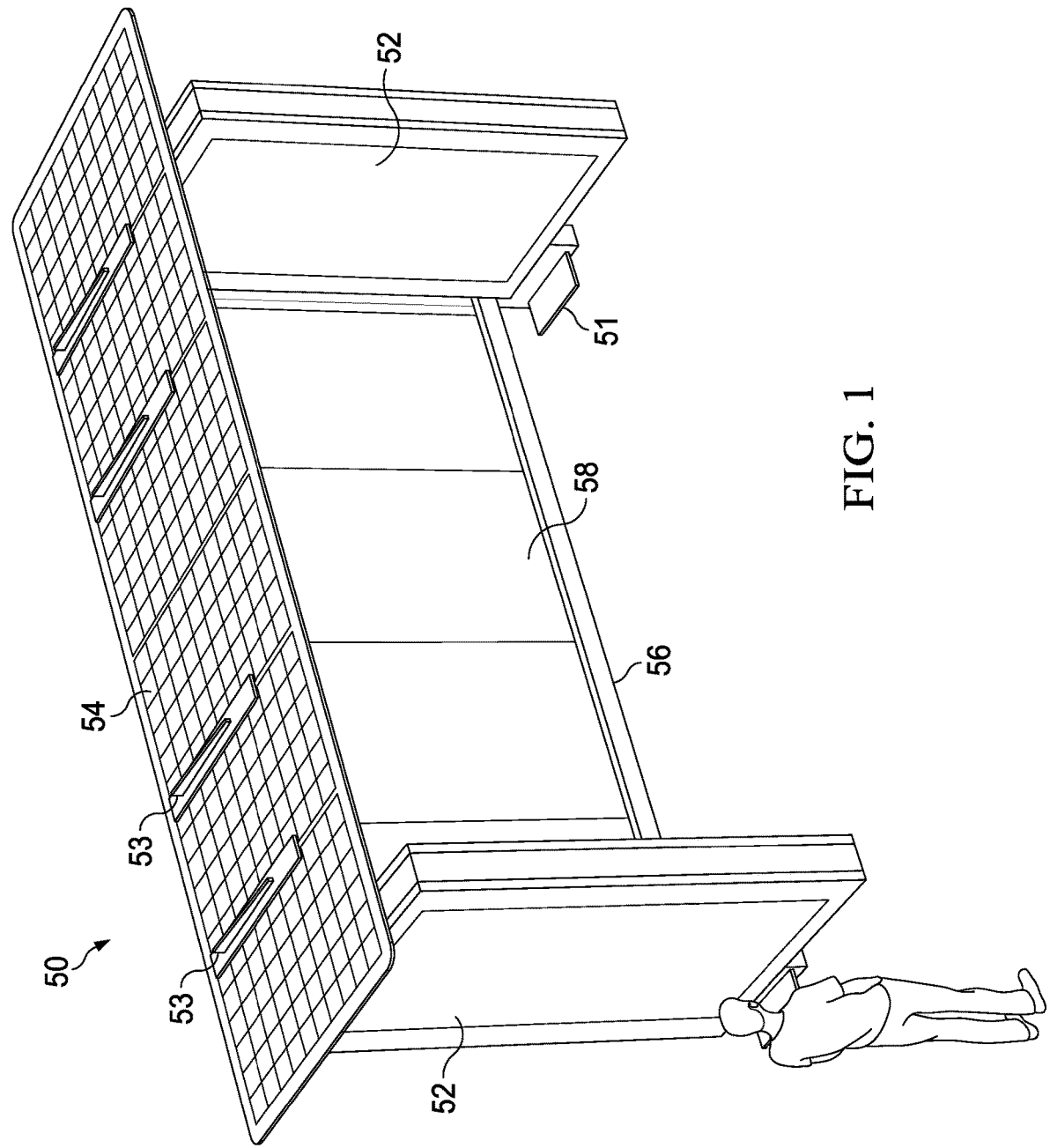
FIG. 1 is a perspective view of an exemplary bus shelter with display units and solar energy harvesting devices (the "bus shelter assembly")
Figure 2:
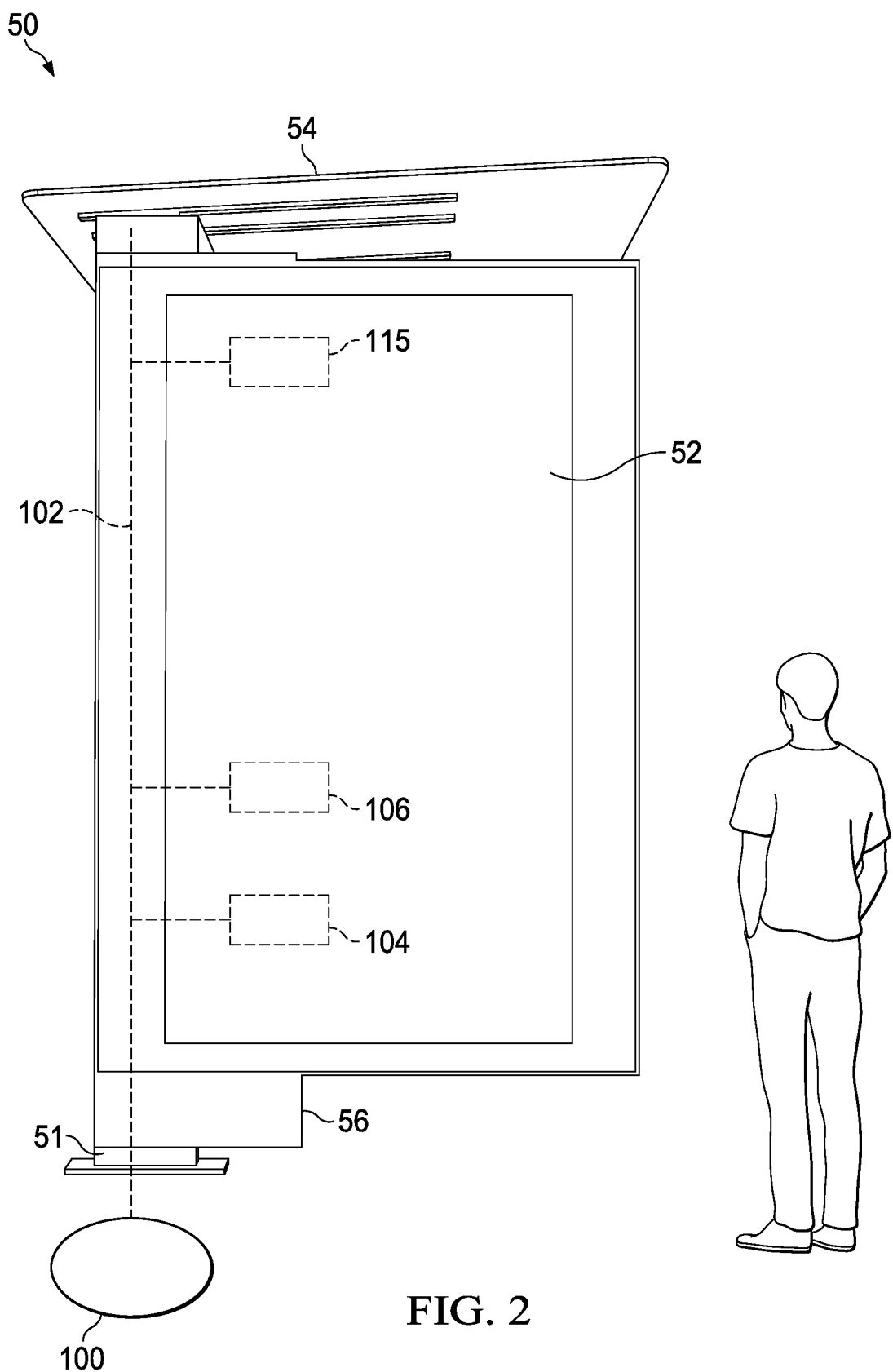
FIG. 2 is a left side view of the bus shelter assembly of FIG. 1 with certain internal components revealed and illustrated in simplified form.
Figure 3:
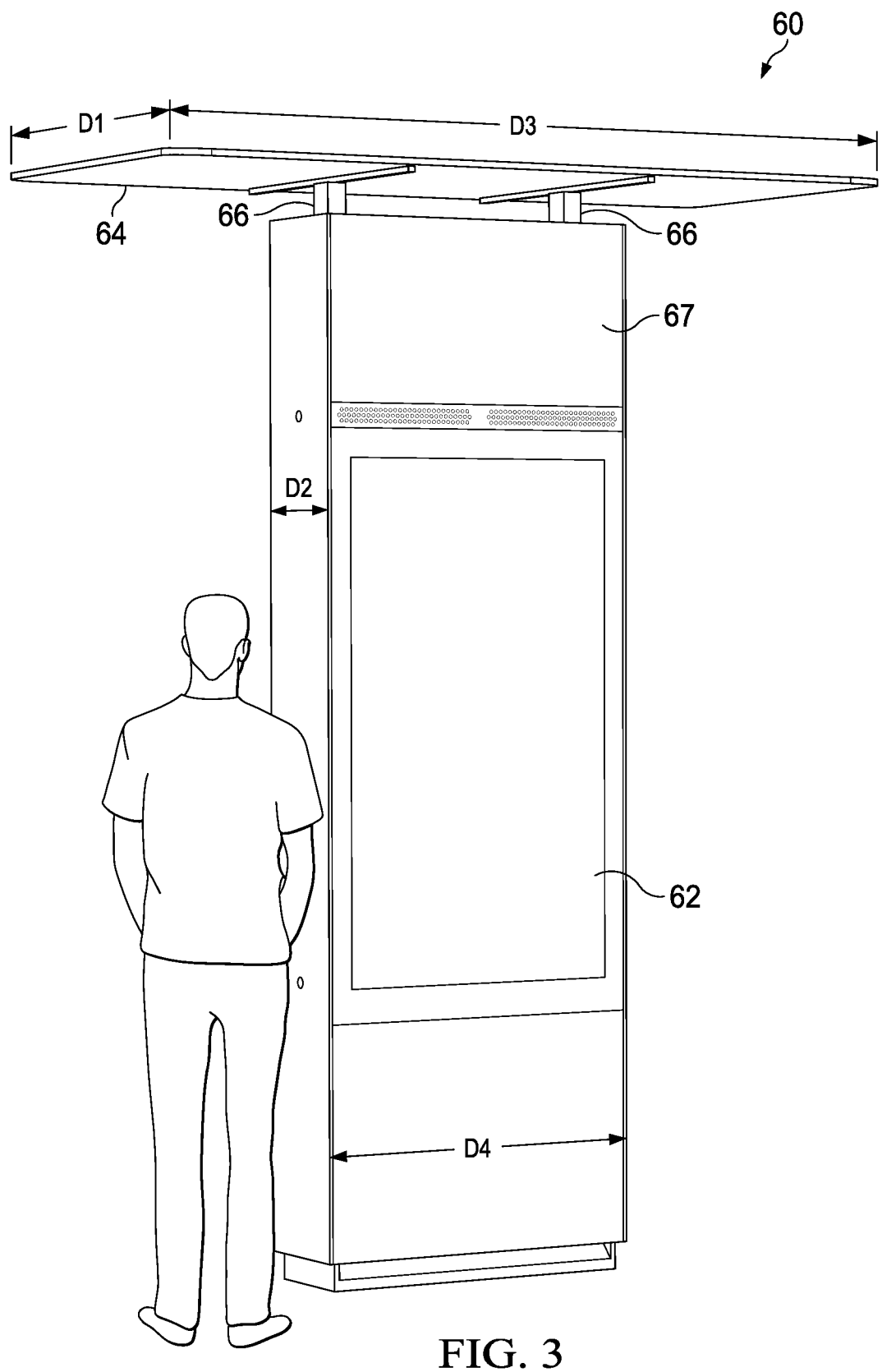
FIG. 3 is a perspective view of an exemplary surface mounted electronic display assembly with solar energy harvesting devices (the "surface mounted assembly")
Figure 4:
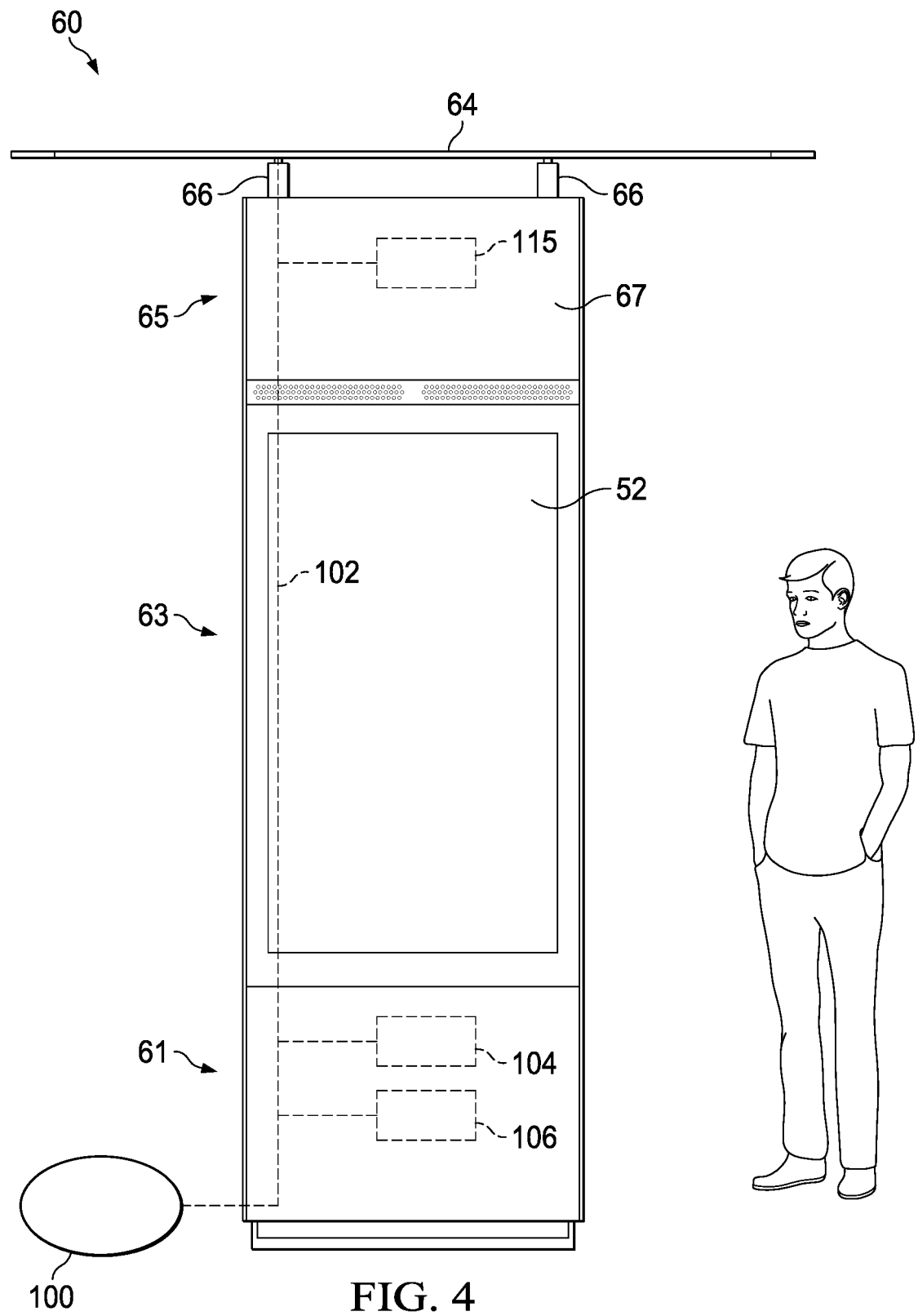
FIG. 4 is a rear view of the surface mounted assembly of FIG. 3 with certain internal components revealed and illustrated in simplified form.
Figure 5:
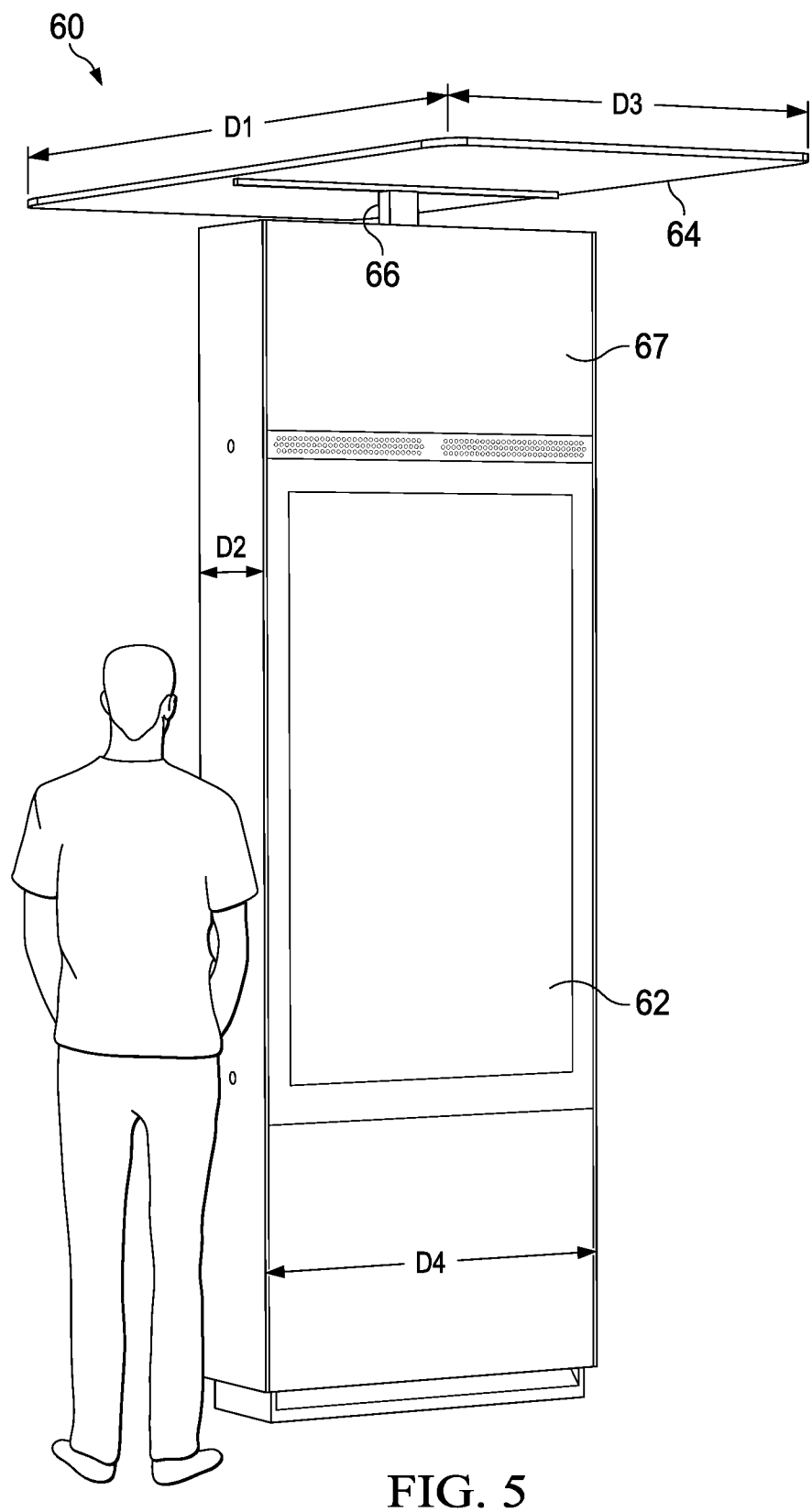
FIG. 5 is a perspective view of another exemplary surface mounted assembly.
Figure 6:
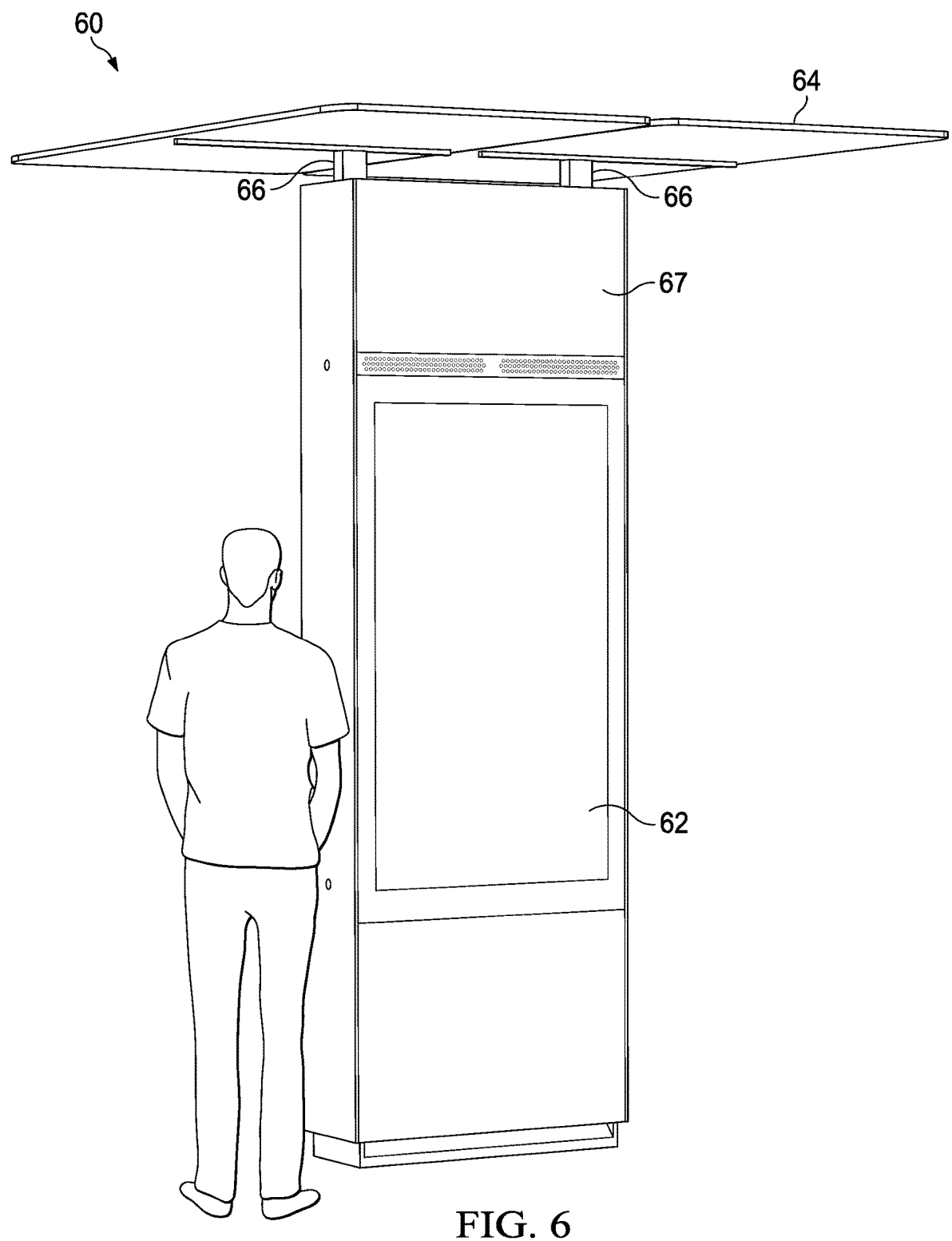
FIG. 6 is a perspective view of another exemplary surface mounted assembly.
Figure 7:
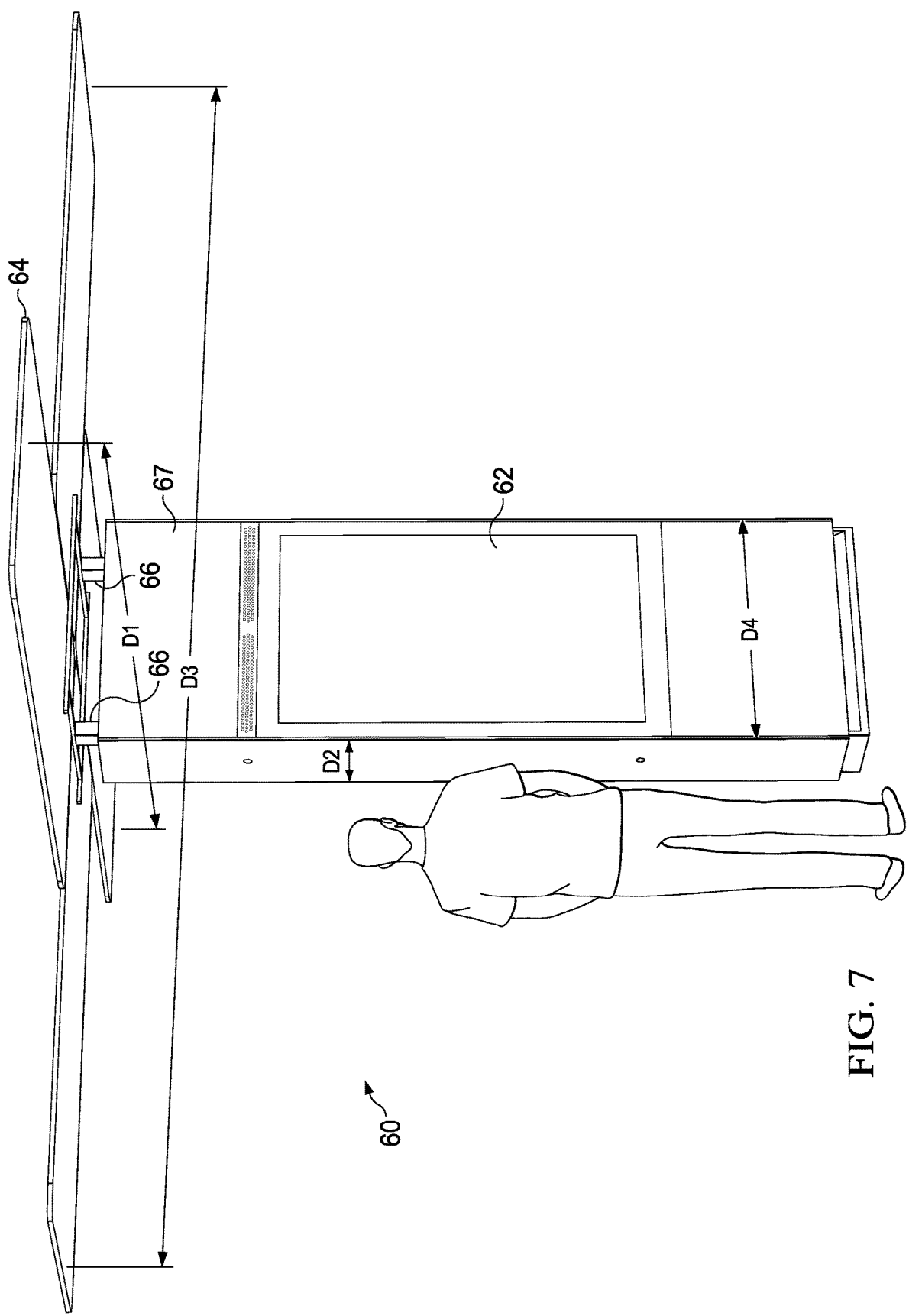
FIG. 7 is a perspective view of another exemplary surface mounted assembly.

FIG. 1 and FIG. 2 illustrate exemplary bus shelter assemblies 50. The bus shelter assembly 50 may comprise one or more members 56 forming the structure of the bus shelter assembly 50. One or more feet 51 may be provided for attaching the bus shelter assembly 50 to a sidewalk, the ground, a parking lot, or the like. One or more panels 58 may be located along a rear wall of the bus shelter assembly 50. The panels 28 may be located between at least two of the members 56. The panels 28 may be comprised of an opaque, transparent, or translucent material. Any design, type, or style of bus shelter assembly 50 may be utilized.

The bus shelter assembly 50 may comprise one or more display units 52. The display units 52 may be configured to display, for example, advertisements, public service announcements, and the like. These display units 52 may include displays of any type, size, orientation, and/or shape without departing from the scope of the present disclosure. Further, these display units 52 may be mounted at any suitable location on the bus shelter assembly 50 such as, for example, on either side of the bus shelter assembly 50 and/or to the members 56.

One or more solar energy harvesting devices 54 may be mounted along, or may form, the roof of the bus shelter assembly 50. Where members 56 are provided that form the structure of the roof, the solar energy harvesting device 54 may be mounted onto said members 56. The solar energy harvesting devices 54 may provide shade, rain, and other weather protection for individuals using the bus shelter assembly 50. In exemplary embodiments, the solar energy harvesting devices 54 may extend over one or more of the display units 52 to provide at least partial shade to the display units 52. Though the solar energy harvesting devices 54 may be employed to provide shade, the solar energy harvesting devices 54 may be opaque. However, in other exemplary embodiments, the solar energy harvesting devices 54 may be transparent and/or translucent.

Various roof members 53 may be located between the individual panels of the solar energy harvesting devices 54 to provide structural support and rigidity. As such, it is generally contemplated that said roof members 53 may be of sufficient strength, rigidity, and other material properties so as to provide such structural support and rigidity. In one or more examples, the roof members 53 may be configured to support the solar energy harvesting devices 54 at an angle to improve solar energy gathering.

An electrical pathway 102 may be provided between the solar energy harvesting devices 54 and the display units 52. Through this electrical pathway 102, electrical energy generated by the solar energy harvesting devices 54 may be routed to the display units 52 to power the same. A controller 106 may be located along the electrical pathway 102 and configured to direct the flow of electrical energy, depending on where it is needed. For example, the controller 106 may be configured to direct the display units 52 to utilize electrical energy from the solar energy harvesting devices 54, an electrical grid 100, some combination thereof, and/or the like. Alternatively, or additionally, the controller 106 may be configured to monitor electrical draw from the display units 52 and/or electrical production from the solar energy harvesting device 54. Electrical draw and production may be monitored (e.g., quantified) using any suitable measurement value such as, for example without limitation, micro-watts. In monitoring this information, the controller 106 may be configured to determine which energy source(s) to utilize for one or more components of the bus shelter assembly 50.

One or more sensors 115 may be utilized to detect the power generated by the solar energy harvesting device 54.

Data from the sensors 115 may be used by the controller 106 to control operations. The electrical pathway 102, the controller 106, and the sensors 115 may be located internally within the display units 52, one or more of the members 56, the solar energy harvesting device 54, other component of the bus shelter assembly 50, or may be external to the bus shelter assembly 50. The controller 106 may be interposed between the display units 52, the electrical grid 100, and the solar energy harvesting device 54.

FIG. 3 through FIG. 7 illustrate exemplary sidewalk assemblies 60. The sidewalk assemblies 60 may be configured for placement in any suitable location, such as sidewalks, parking lots, and/or other public places, and may be mounted to the ground, a sidewalk, a parking lot, a wall, a building, or another structure or surface. Each surface mounted assembly 60 may include one or more display units 62, support members 66, and solar energy harvesting devices 64. Further, each display unit 64 may include one or more electronic displays.

Sidewalk assemblies 60 having more than one display unit 62 may position said display units 62 in any suitable arrangement. For example, without limitation, a single, double, triple, or quadruple sided set of display units 62 may be provided in a given surface mounted assembly 60. Similarly, the electronic displays within each display unit 62 may also be positioned in any suitable arrangement. Any number, size, arrangement, and type of electronic displays may be utilized. Further, each electronic display may be provided in the same or a separate display unit 62, which may be physically connected to one another such as in a triangular or rectangular shape.

One or more support members 66 may extend above the display units 62 to one or more solar energy harvesting devices 64. Practically speaking, the support member(s) 66 support the weight the solar energy harvesting devices 64 and, as such, should generally comprise the strength and rigidity required to do so. The support members 66 may be assembled in any suitable arrangement. For example, the support member 66 may extend from an upper surface of a housing 67. In another example, the support members 66 may be anchored within the display units 62 or other components of the surface mounted assembly 60.

The one or more solar energy harvesting devices 64 may have a maximum first dimension D1 which extends beyond the maximum second dimension D2 of the surface mounted assembly 60. The dimensions D1 and D2 may be depth of the solar energy harvesting devices 64 and the surface mounted assembly 60, respectively. Alternatively, or additionally, the one or more solar energy harvesting devices 64 may have a maximum third dimension D3 which extends beyond the maximum fourth dimension D4 of the surface mounted assembly 60. The dimensions D3 and D4 may be width of the solar energy harvesting devices 64 and the surface mounted assembly 60, respectively. Stated another way, the solar energy harvesting devices 64 may have a footprint which extends beyond the footprint of the surface mounted assembly 60. In this way, the solar energy harvesting devices 64 may shade some or all of the display units 62 of the surface mounted assembly 60. While D1, D2, D3, and D4 may represent maximum dimensions, one or more of D1, D2, D3, and/or D4 may represent minimum dimensions. For example, without limitation, the minimum dimensions of the solar energy harvesting devices 64, D1 and/or D3, may be greater than the maximum dimensions of the surface mounted assembly 60, D2 and D4.

The solar energy harvesting devices 64 may extend laterally. Stated another way, the solar energy harvesting devices 64 may extend along the width of the display units 62. Stated yet another way, the solar energy harvesting devices 64 may extend from left to right or right to left when viewed from the front or rear. Alternatively, or additionally, the solar energy harvesting devices 64 may be oriented to extend towards or away from an intended viewer of the display units 62 when viewed from the front or rear. Stated another way, the solar energy harvesting devices 64 may extend along the depth of the display units 62 when viewed from the front or rear. Stated yet another way, the solar energy harvesting devices 64 may extend into or out of the page when viewed from the front or rear of the surface mounted assembly 60.

Any number of solar energy harvesting devices 64 may be provided in any orientation. For example, without limitation, two of the solar energy harvesting devices 64 may be provided to extend in parallel to one another. As another example, without limitation, the solar energy harvesting devices 64 may extend both laterally and towards and way from an intended viewer of the display units 62. As yet another example, without limitation, multiple solar energy harvesting devices 64 may be provided in a fanned array such that some of the solar energy harvesting devices 64 extend in different directions compared to other solar energy harvesting devices 64 for the surface mounted assembly 60. Other orientations may be employed without departing from the scope of the present disclosure.

In exemplary embodiments, the sidewalk assemblies 60 may each comprise an upper portion 65, an electronic display layer portion 63, and a lower portion 61. In exemplary embodiments, the controller 106 may be located in the lower portion 61. In other exemplary embodiments, the controller 106, may be located in electronic display layer portion 63, such as but not limited to, within a sealed plenum between a front facing and rear facing electronic display layer so that such components may be protected from flooding and/or contaminates in the ambient air. In yet another example, the upper portion 65 may be comprised of material configured to permit radio and/or other signals to enter and exiting the upper portion 65. Communication equipment may be placed in the upper portion 65 to further increase the ability to transmit and receive signals. The electrical pathway 102 may extend through one or more of the support members 66 to place in electrical communication one or more components of the surface mounted assembly 60, regardless of which portion 61, 63, 65 they are located in. Accordingly, in one or more examples, the support member 66 may be hollow to accommodate the necessary wiring. Those skilled in the art will appreciate that other locations and configurations for such components may be utilized without departing from the scope of the present disclosure.

Figure 8:
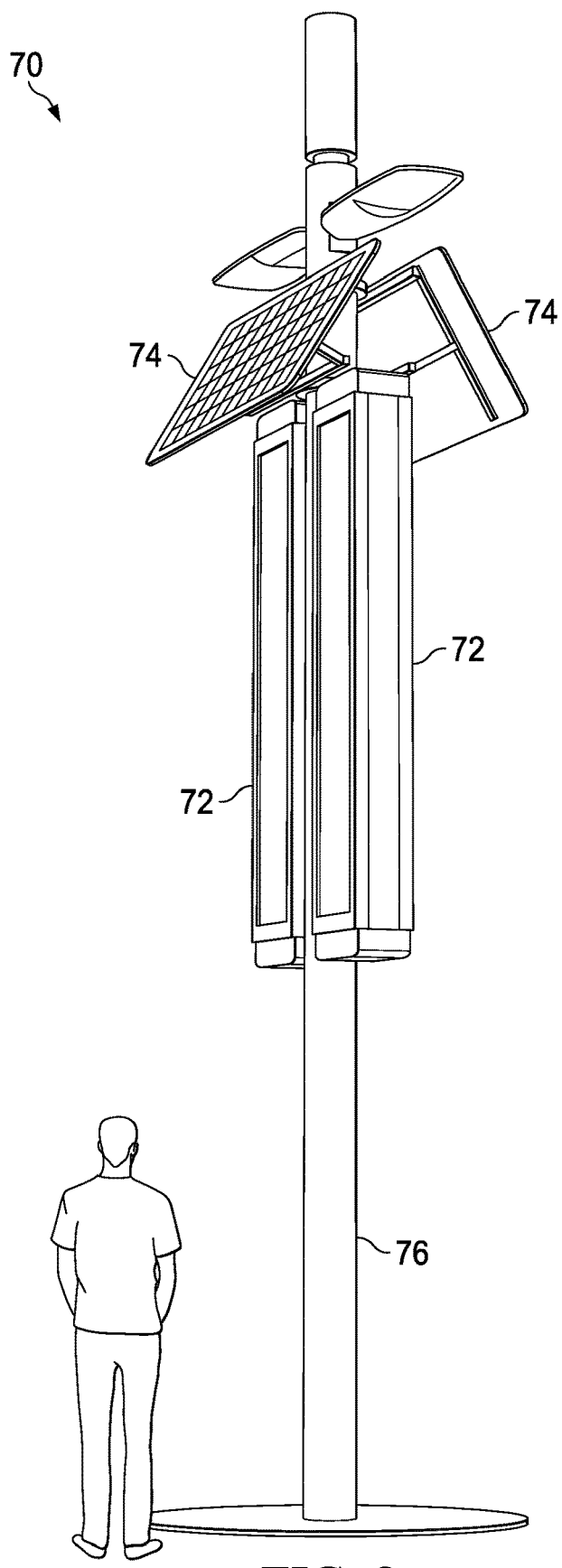
FIG. 8 is a perspective view of an exemplary pole mounted electronic display assembly with solar energy harvesting devices (the "pole mounted assembly")
Figure 9:
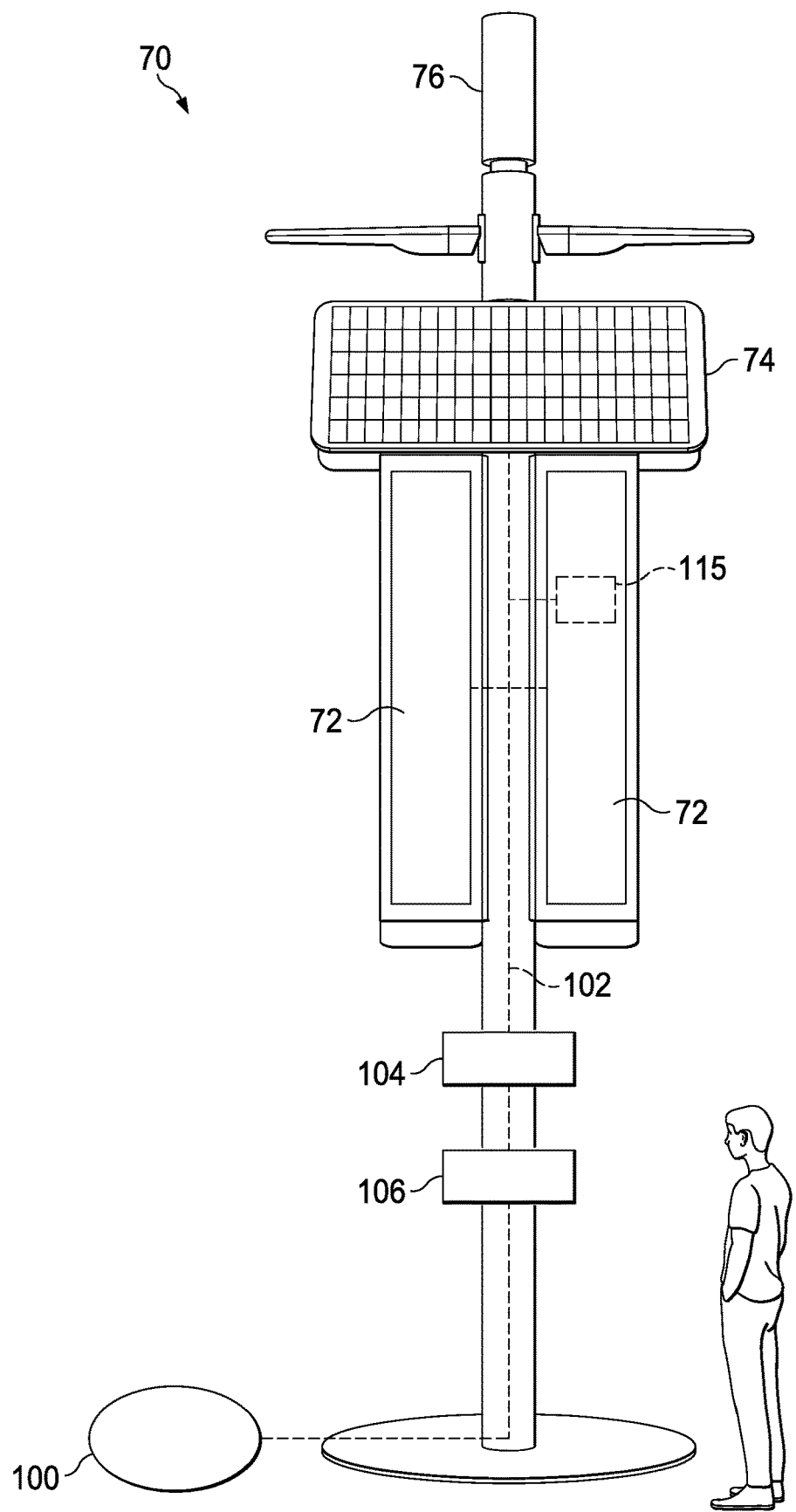
FIG. 9 is a front view of the pole mounted assembly of FIG. 8 with certain internal components revealed and illustrated in simplified form.
Figure 10:
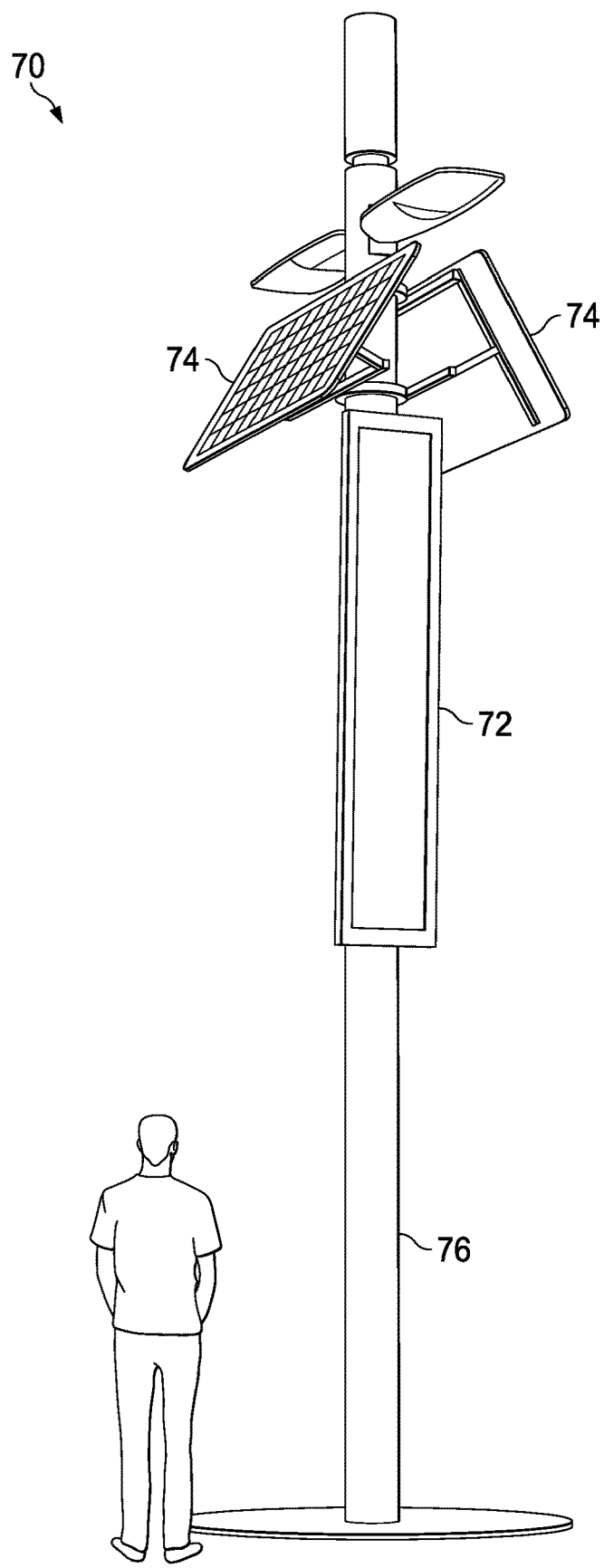
FIG. 10 is a perspective view of another exemplary pole mounted assembly.
Figure 11:
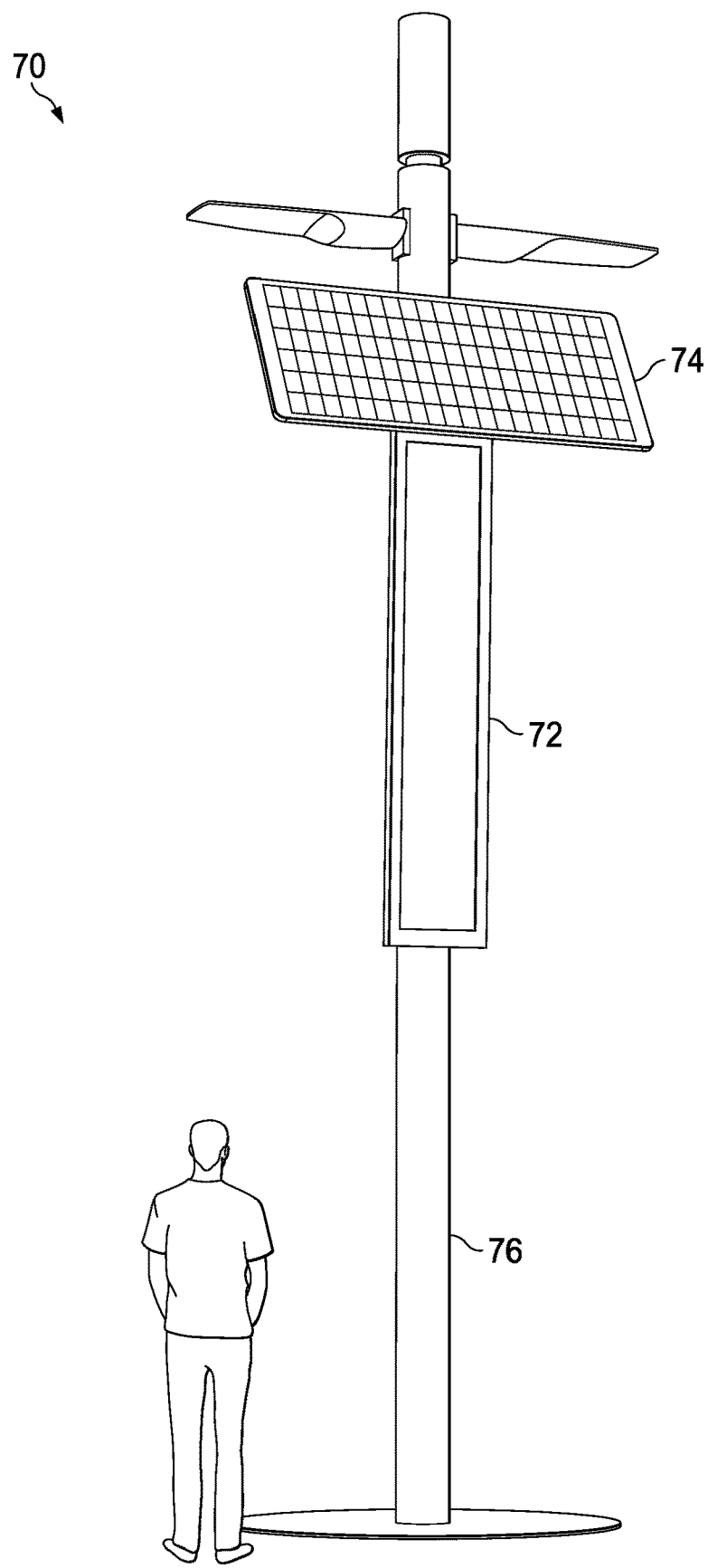
FIG. 11 is a perspective view of another exemplary pole mounted assembly.
Figure 12:
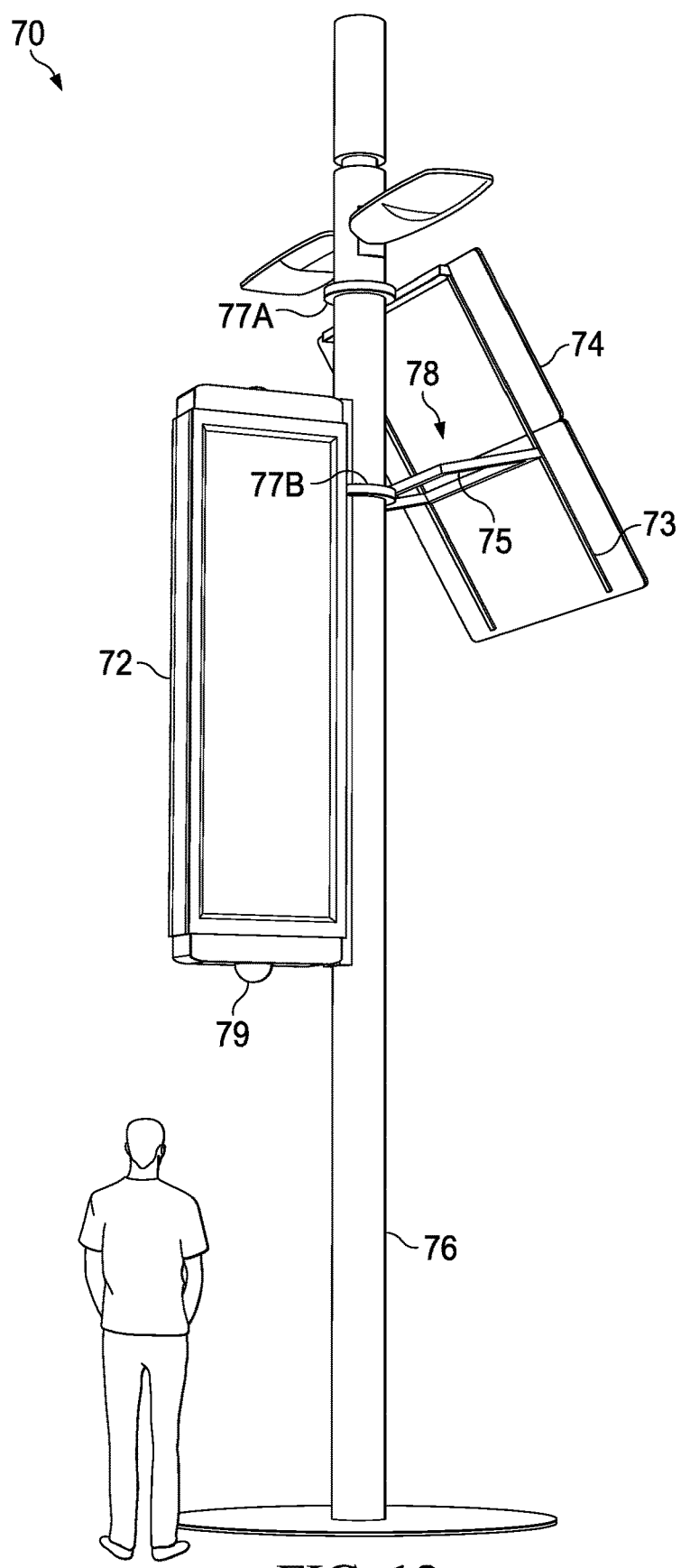
FIG. 12 is a perspective view of another exemplary pole mounted assembly.
Figure 13:
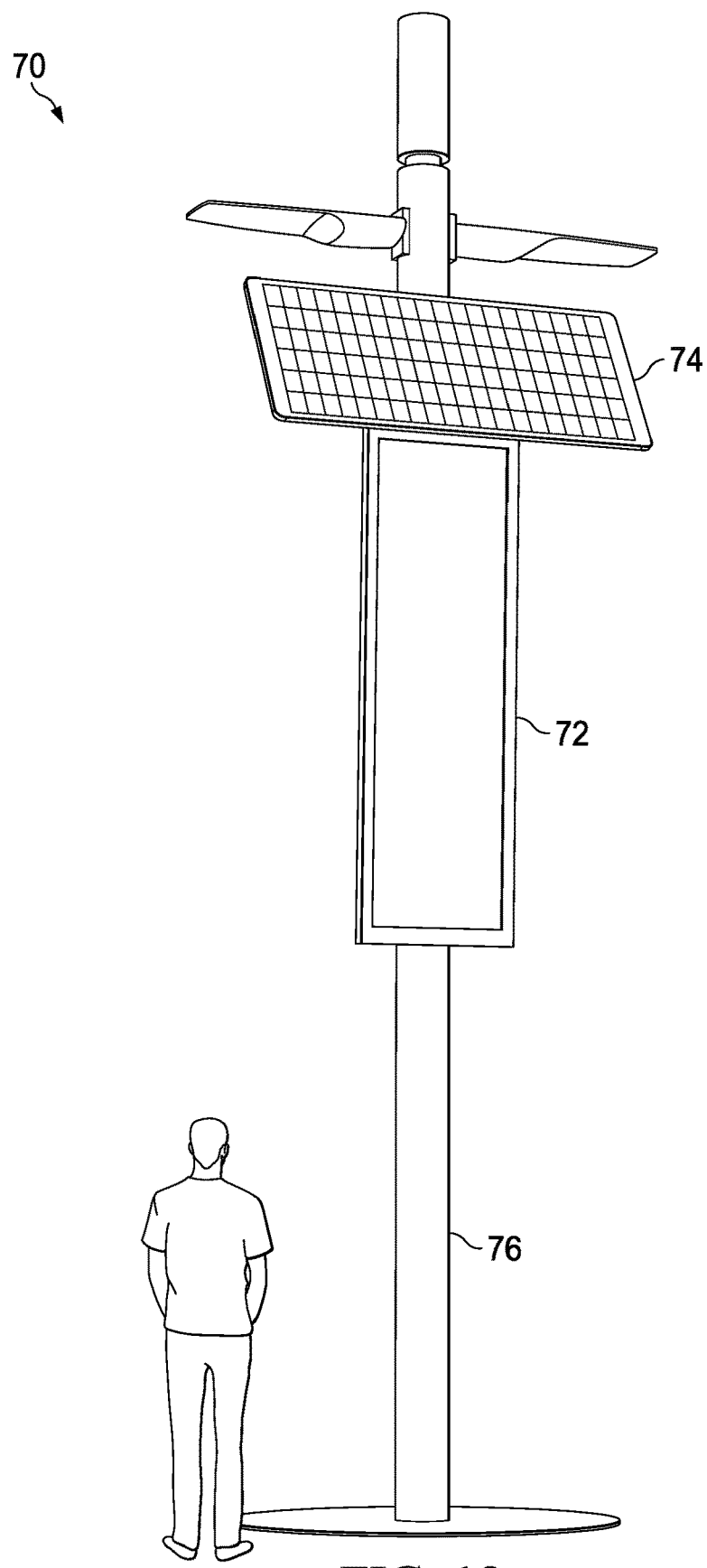
FIG. 13 is a perspective view of another exemplary pole mounted assembly.
Figure 14:
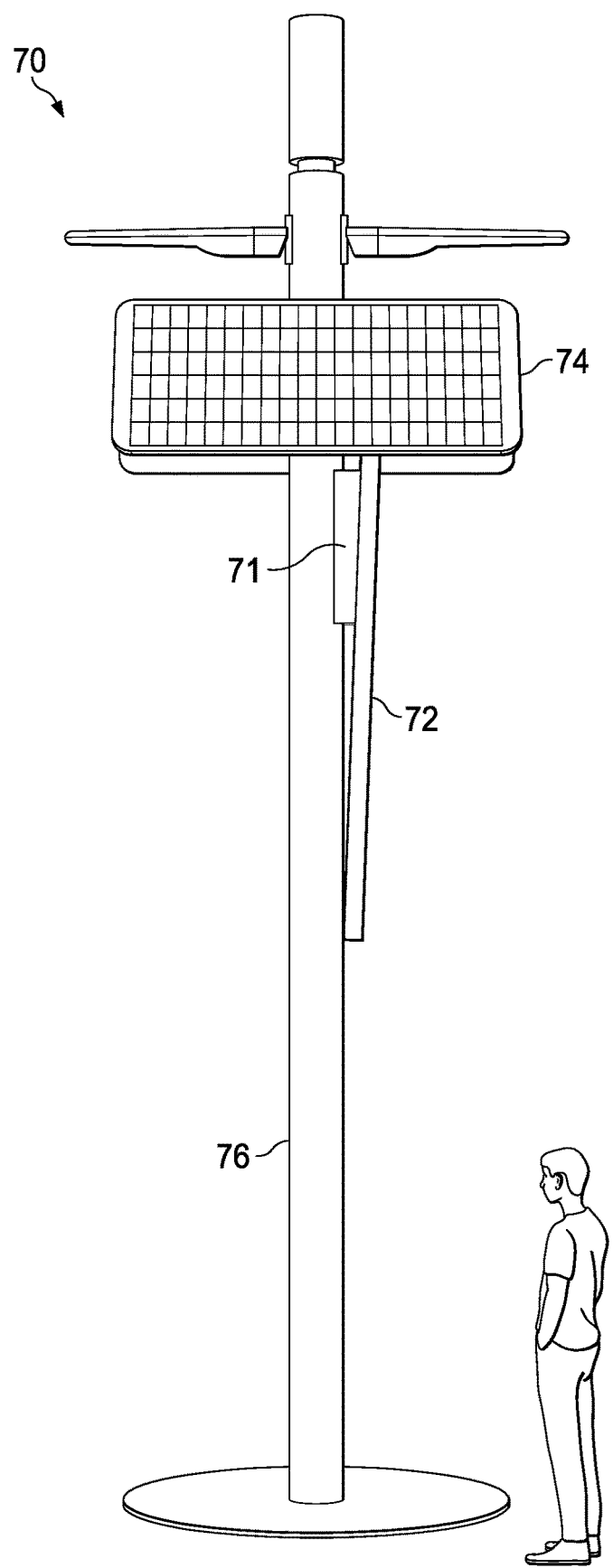
FIG. 14 is a left side view of another exemplary pole mounted assembly.
Figure 15:
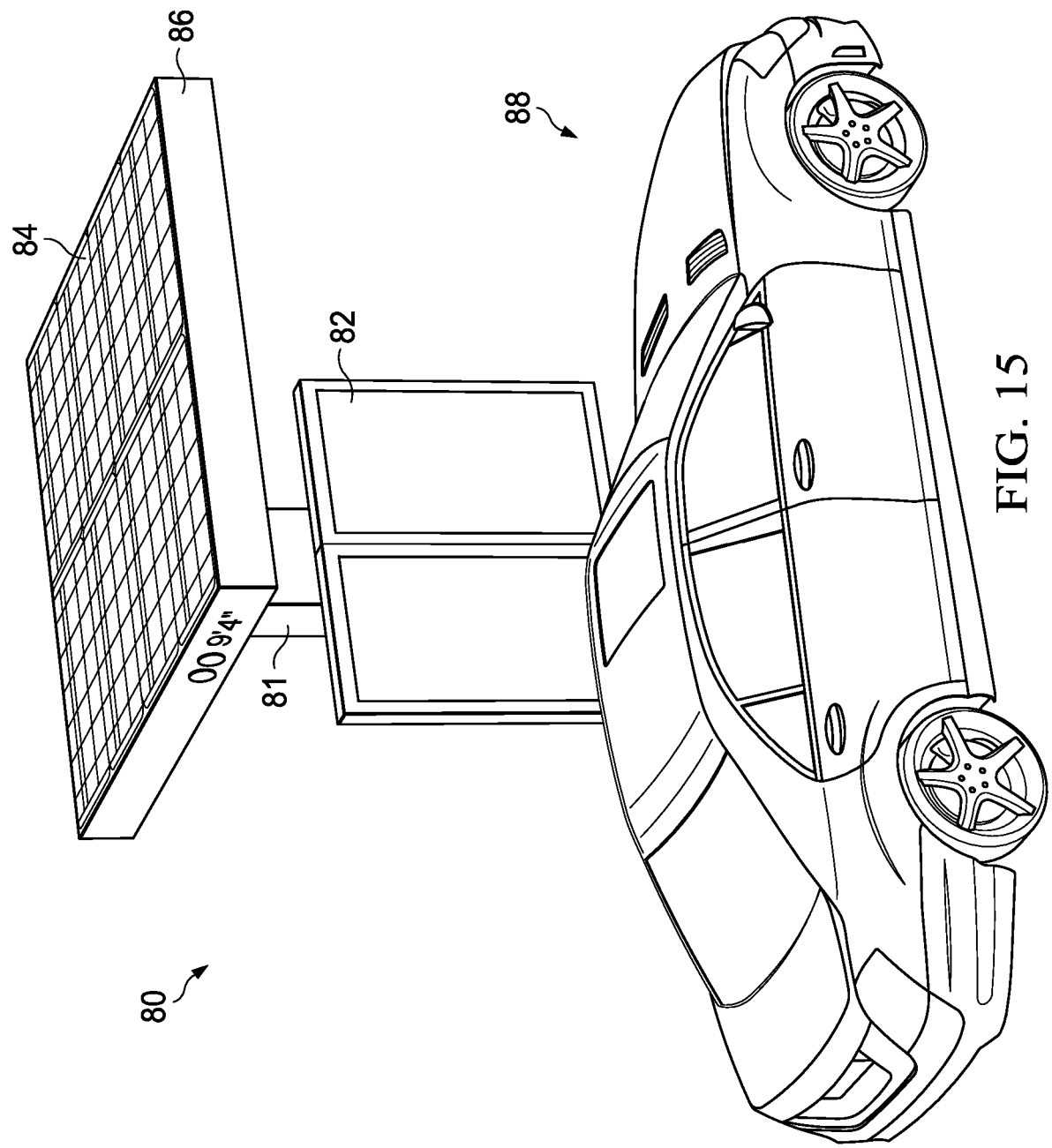
FIG. 15 is a perspective view of an exemplary drive through canopy with an electronic display assembly and solar energy harvesting devices (the "canopy assembly")
Figure 16:
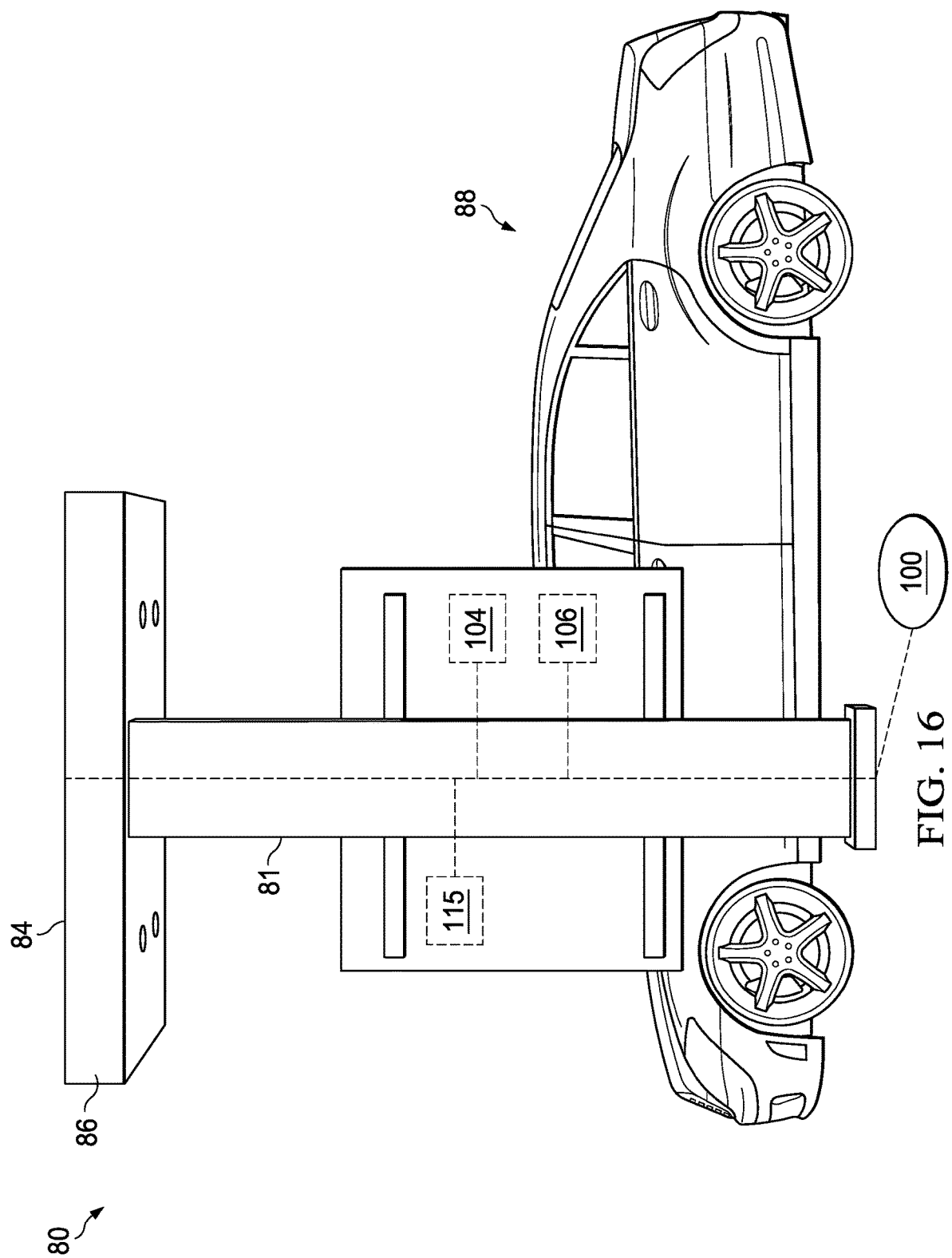
FIG. 16 is a rear view of the canopy assembly of FIG. 15 with certain internal components revealed and illustrated in simplified form.
Figure 17:
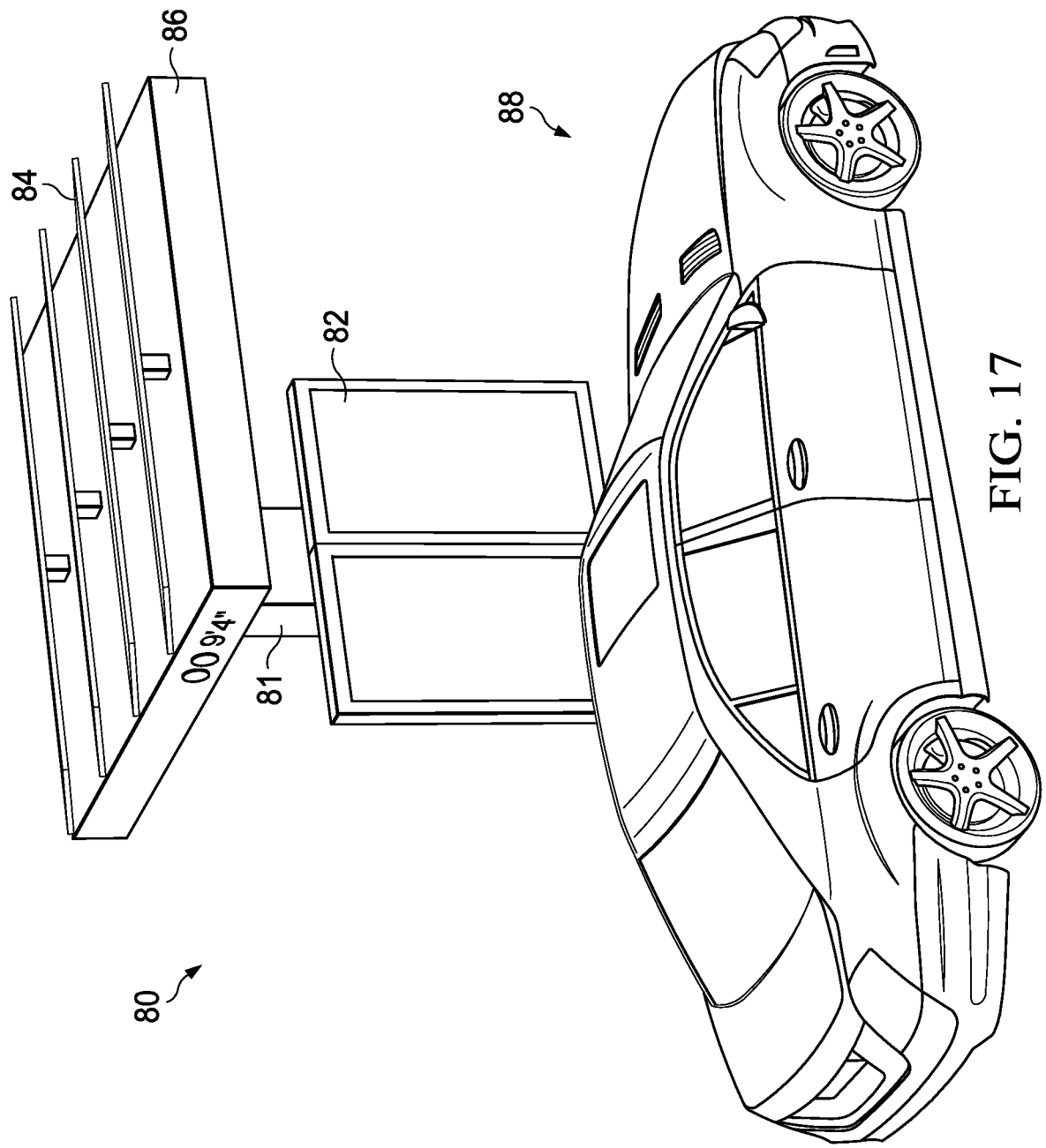
FIG. 17 is a perspective view of the canopy assembly of FIG. 15 with the solar energy harvesting devices in a second position.
Figure 18:
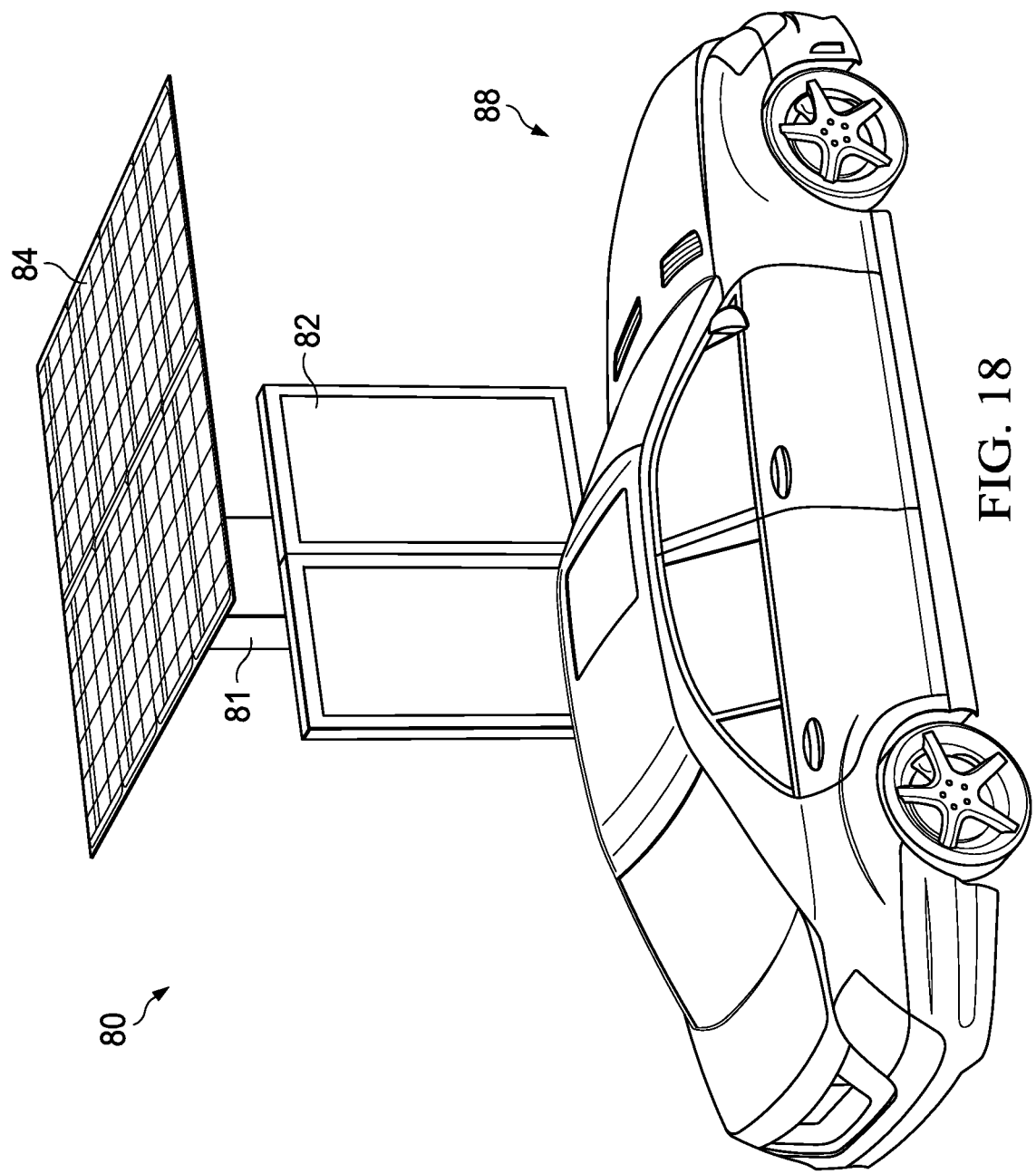
FIG. 18 is a perspective view of another exemplary canopy assembly.

FIG. 8 though FIG. 14 illustrate exemplary pole mounted assemblies 70. The pole mount assemblies 70 may each comprise a pole 76, one or more display units 72, and one or more solar energy gathering devices 74.

The pole 76 may comprise any shape, and may be mounted in any location. For example, without limitation, the pole 76 may be mounted to the ground, a sidewalk, a building, or other structure or surface. The pole 76 may comprise a circular, triangular, rectangular, square, hexagonal, octagonal cross-section, some combination thereof, and/or the like. The pole 76 may comprise a pre-existing pole, having a pre-existing function, that was simply adapted into a pole mounted assembly. The pole 70 may comprise a light pole, a flag pole, a support pole, a column, some combination thereof, and/or the like.

One or more display units 72 may be mounted to the pole 76 in any orientation. For example, without limitation, one, two, three, or four display units 72 may be mounted to the pole 76, and may be evenly spaced around the pole 76, though such is not required. These display units 72 may be similar or different in size and/or shape (e.g., substantially cuboid in shape and/or comprising rounded edges). In exemplary embodiments, the display units 72 may be mounted to the pole 76 in a flag orientation wherein a side surface of the housing for the display units 72 is mounted to the pole 76. If more than one display units 72 are to be mounted, such display units 72 may be mounted parallel to one another on opposing sides of the pole 76. One or more of the display units 72 may alternatively or additionally be flush mounted to the pole 76 wherein a rear surface of the housing for the display units 72 may be mounted to the pole 76. Where more than one display unit 72 is mounted to the pole 76, such display units 72 may be in a back-to-back arrangement on opposing sides of the pole 76. Combinations of flush mounted display units 72 and flag mounted display units 72 may be utilized on a given pole 76. A mounting fixture 71 may extend from each of the display units 72 to the pole 76. In exemplary embodiments, the mounting fixture 71 may be attached to the housing for the display units 72. Alternatively, or additionally, the mounting fixture 71 may be attached to internal structural components of the display units 72 and may extend through the housing for the display units 72. At least one surface of the mounting fixture 71 may be configured to substantially match the shape of the pole 76. For example, without limitation, the mounting fixture 71 may comprise a plate for mounting to a pole 76 having a flat outer surface for mounting to the display unit 72 and a curved inner surface for mounting to a curved pole 76.

The mounting fixture 71 may comprise a collar 77B configured to wrap around some or all of the outer surface of the pole 76. The mounting fixture 71 may alternatively or additionally comprise members, fasteners, nuts, receivers, bolts, screws, nails, adhesive, weld material, straps, some combination thereof, or the like. Attachment of the display units 72 to the pole 76 may be performed by wrapping straps around the pole 76, drilling holes in the pole 76, fastening, bolting, screwing, nailing, welding, bonding, or otherwise attaching the display units 72 to the pole 76. Any type, shape, or size mounting fixture 71 may be utilized. Any type of attachment technique may be utilized.

The display units 72 may comprise one or more peripheral devices 79. Such peripheral devices 79 may include, but is not limited to, network connectivity devices, power modules, microphones, cameras, antenna, ambient light sensors, ambient temperature sensors, air quality monitors, some combination thereof, and/or the like. Such peripheral devices 79 may be provided in a dome, a protrusion, or other structure along an upper, lower, or side surface of the housing for the display units 72.

One or more solar energy harvesting devices 74 may be mounted to the pole 76. Such solar energy harvesting devices 74 may be mounted above the display units 72, though such solar energy harvesting devices 74 may be mounted at any location. In exemplary embodiments, the solar energy harvesting devices 74 may extend at an angle from the pole 76. The solar energy harvesting devices 74 may extend perpendicular to the ground. The support structures 78 may comprise one or more collars 77A, 77B which wrap around the pole 76.

The solar energy harvesting devices 84 may extend from the same or a different side of the pole 76 as the display units 72. An upper and lower edge of the solar energy harvesting devices 74 may extend parallel with an upper and lower edge of the display units 72, though such is not required. The solar energy harvesting devices 74 may be oriented on the pole 76 to cast shade of the display units 72 during some or all of the day.

FIG. 15 through FIG. 18 illustrate exemplary canopy assemblies 80. Canopies 86 of any size or style may be utilized, though it is generally contemplated that canopies 86 may preferably be sized and shaped to extend (e.g., horizontally) over some or all of a vehicle 88 located adjected to the canopy assembly 80. In this way, the canopy 86 may provide shade to some or all of the display units, as well as to some or all of the vehicle 88, thereby also preventing rain from entering the vehicle 88 when a window of the vehicle is rolled down.

The canopy assemblies 80 may include a vertically extending member 81 which extends from the ground to a position along the canopy 86 (or the solar energy harvesting devices 84, discussed below) where the vertically extending member 81 may securely support the size and weight of the canopy 86 and/or the solar energy harvesting devices 84 (e.g., relatively near the center instead of the periphery of the canopy). Accordingly, it is generally contemplated that the vertically extending member 81 may comprise the necessary strength and/or rigidity required to do so.

One or more display units 82 may be mounted to the canopy assembly 80 or otherwise provided nearby, and may differ in terms of size, arrangement, and composition. In exemplary embodiments, the display units 82 may be mounted to the vertical member 81. The display units 82 may be configured to provide digital menu boards. One or more solar energy harvesting devices 84 may be mounted to the upper portion of the canopy assembly 80. Such solar energy harvesting devices 84 may be mounted flush with an upper surface of the canopy assembly 80. Such solar energy harvesting devices 84 may be mounted at an angle to the upper surface of the canopy assembly 80.

The solar energy harvesting device(s) 84 may be provided either additionally or alternatively to the canopy 86, and may be transparent or translucent. If provided in addition, the solar energy harvesting device(s) 84 may be mounted on top of the canopy 86, or elsewhere. Any suitable orientation may be employed, such as where the solar energy harvesting devices 84 are flush with an upper surface of the canopy assembly 80 and/or where the solar energy harvesting devices 84 are mounted at an angle to the upper surface of the canopy assembly 80. Other orientations and/or combinations of orientations are also contemplated.

Any of the display units 52, 62, 72, 82, may be single sided, double sided, and/or the like. In another example, each of the display units 52, 62, 72, 82 may comprise liquid crystal displays, plasma displays, organic light emitting diode displays, light emitting diode displays, rear projection displays, cathode ray display, some combination thereof, and/or the like. The electronic display(s) within the display units 52, 62, 72, 82 may be provided in any number, size, shape, type, orientation (e.g., landscape or portrait), and/or the like without departing from the scope of the present disclosure. Further, such display units 52, 62, 72, 82 may comprise backlights, such as but not limited to, direct backlights, edge lights, some combination thereof, or the like. Alternatively, or additionally, such display units 52, 62, 72, 82 may also comprise emissive displays. As configured, said display units 52, 62, 72, 82 may be programmed to display any type of information/image/video. In yet another example, each of the display units 52, 62, 72, 82 may alternatively or additionally include poster holders that may include a compartment configured to accommodate signage such as posters, artwork, signage, changeable letter boards, some combination thereof, and/or the like. The compartment may be defined between a transparent cover panel and the electronic display (and/or a poster) within a display unit housing. The poster holders may further include an illumination device for illuminating the signage deposited therein.

The display units 52, 62, 72, 82 may be substantially rectangular in shape, though any size and shape may be utilized. The display units 52, 62, 72, 82 may comprise one or more cooling pathways. Such cooling pathways may comprise openings configured to ingest and exhaust ambient air and move such ambient air though open loop pathways. In exemplary embodiments, such open loop pathways may extend along backlights for the display units 52, 62, 72, 82. Such cooling pathways may include, additionally or alternatively, closed loop pathways located entirely within the display units 52, 62, 72, 82 for circulating gas. In exemplary embodiments, the closed loop pathways may encircle the electronic displays of the display units 52, 62, 72, 82 by passing the circulating gas through a gap between the transparent cover panel and the electronic display surface. One or more electronic components for operating the display units 52, 62, 72, 82 may be provided within, along, or adjacent to the closed loop pathways. Such electronic components may comprise the peripheral devices 79, video players, power supplies, controllers, network connectivity devices, antenna, computers, some combination thereof, or the like. One or more fans may be provided within or along the open loop pathways to force ambient air therethrough. One or more fans may be provided within or along the closed loop pathways to force circulating gas therethrough. A heat exchanger may be provided, preferably behind one or more of the display units 52, 62, 72, 82 to permit heat transfer between the relatively warm circulating gas in the closed loop pathway and the relatively cool ambient air in the open loop pathway.

Any of the solar energy harvesting devices 24, 54, 64, 74, and 84 may utilize opaque, transparent, and/or translucent panels, and may be provided in any size, shape, orientation (e.g., flush or mounted at an angle), number, type, and/or the like. These solar energy harvesting devices 24, 54, 64, 74, and 84 may comprise any number of photovoltaic cells. Some or all of the solar energy harvesting devices 24, 54, 64, 74, and 84 may be configured to swivel, pivot, tilt, rotate, some combination thereof, or the like. Such movement may be accomplished manually or automatically, such as by motor and controller configured to track the sun's movement.

While the solar energy harvesting devices 24, 54, 64, 74, and 84 may be shown or described herein as being mounted on, or otherwise associated with, various structures, such as but not limited to, the bus shelter assembly 50, the surface mounted assembly 60, the pole mounted assemblies 70, and the canopy assemblies 80, some or all of such solar energy harvesting devices 24, 54, 64, 74, and 84 may, alternatively or additionally, be positioned elsewhere such as, without limitation, on the adjacent ground, on a nearby structure (e.g., roof or pole), some combination thereof, or the like. This may permit improved position for efficient collection of solar energy as well as the ability to use an expanded surface area for powering the units.

Figure 19:
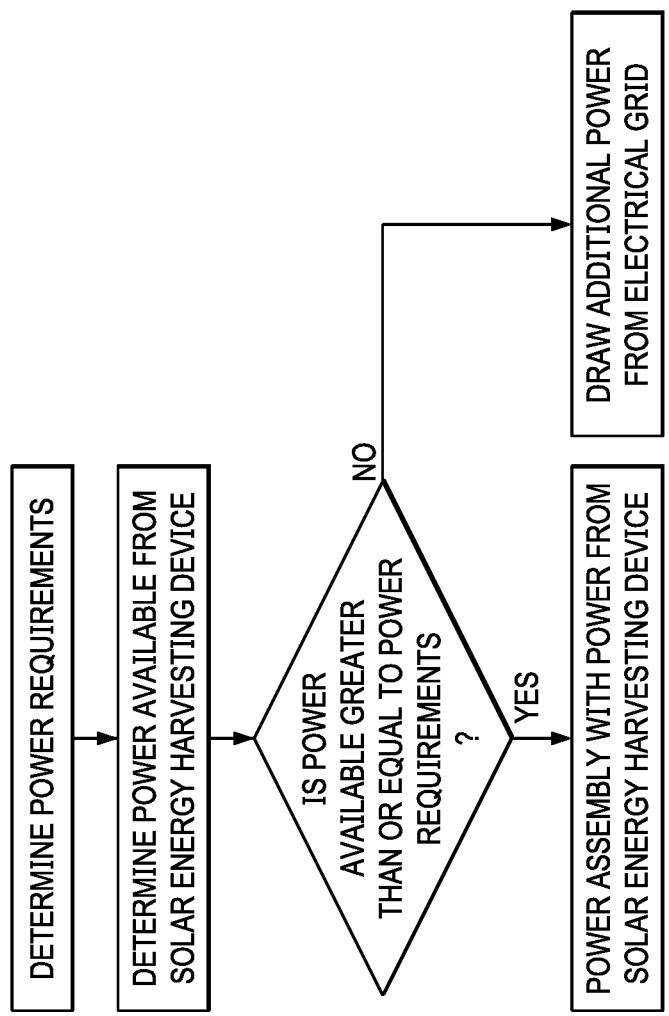
FIG. 19 is a flow chart with exemplary logic for operating the assemblies of FIGS. 1-18 and 20-24.

FIG. 19 provides a flowchart with exemplary logic for operating the various assemblies 50, 60, 70, 80 and related components. The controller 106 may determine the amount of power needed to operate the assembly 50, 60, 70, 80. This determination may be performed by the controller 106 and may be based, at least in part, on readings from the sensors 115, operational data from the assemblies 50, 60, 70, 80, historical information, predictions, some combination thereof, or the like. The amount of electrical energy collected by the solar energy harvesting device 54, 64, 74, 84 may be determined. The solar energy harvesting devices 54, 64, 74, 84 may be located at least 9.5 ft above the ground surface, though any height may be utilized. The controller 106 may be configured to determine if the energy collected is greater than or equal to the power needed. If yes, the controller 106 may be configured to power the assembly 50, 60, 70, 80 only with the power collected by the solar energy harvesting device 54, 64, 74, 84. If no, the controller 106 may be configured to draw all available energy from the solar energy harvesting devices 54, 64, 74, 84 and draw supplemental power from the electrical grid 100 sufficient to power the assembly 50, 60, 70, 80.

In one non-limiting example, power generated by the solar energy harvesting devices 54, 64, 74, 84 may be used to power the display units 52, 62, 72, 82 when conditions are sufficiently sunny. In this example, the power generated by the solar energy harvesting devices 54, 64, 74, 84 may be greater than or equal to the power needed to operate the assembly. If there is excess energy, that energy may be transmitted back into the electrical grid 100.

In another non-limiting example, the power generated by the solar energy harvesting devices 54, 64, 74, 84 may be insufficient to operate the display units 52, 62, 72, 82. This may occur, for example, when the solar energy harvesting devices is not receiving enough solar energy (e.g., too cloudy, obstructions blocking sunlight, debris on the solar energy harvesting devices, etc.). In which case, the assemblies 50, 60, 70, 80 may draw energy from the electrical grid 100, but preferably only to the extent it is needed to compensate for the insufficient amount of energy generated by the solar energy harvesting devices 54, 64, 74, 84.

For example, without limitation, power generated by the solar energy harvesting devices 54, 64, 74, 84 may be used to power the display units 52, 62, 72, 82 when conditions are sufficiently sunny. Excess energy, if any, may be transmitted back into the electrical grid 100, though such is not required.

The use of energy collected by the solar energy harvesting devices 54, 64, 74, 84 may reduce the environmental impact of the assemblies 50, 60, 70, 80 by reducing the degree to which said assemblies rely on the electrical grid 100. The use of such solar energy harvesting devices 54, 64, 74, 84 may serve as a more environmentally sustainable, alternative energy source. The display units 52, 62, 72, 82 may be periodically, or continuously, powered by the solar energy harvesting device 54, 64, 74, 84. Alternatively, or additionally, the assemblies 50, 60, 70, 80 may generate revenue by placing electricity back into the electrical grid 100.

Bulk energy storage devices 104, such as batteries, super capacitors, ultra-capacitors, and the like, are commonly used to store energy. The solar energy harvesting devices 54, 64, 74, 84 may store energy in the bulk energy storage devices 104 when the solar energy harvesting devices 54, 64, 74, 84 are generating a surplus of energy (e.g., such as when it is sunny). Then, when the energy generated by the solar energy harvesting devices 54, 64, 74, 84 starts to diminish (e.g., such as when it is dark), stored energy within the bulk energy storage devices 104 may be used to provide power.

In exemplary embodiments of the assemblies, however, no bulk energy storage devices 104 are used. Such bulk energy devices 104 can be seen as a liability as they, for example without limitation, may comprise flammable materials, may require rare earth materials, may take up physical space within the assembly, may require periodic replacement, to name a few examples, without limitation. Because the assemblies 50, 60, 70, 80 of the present disclosure are capable of drawing supplemental energy from the electrical grid 100, in exemplary embodiments, such bulk energy storage devices 104 are not required.

In exemplary embodiments, no AC-DC converters are required. For example, without limitation, the display units 52, 62, 72, 82 may be configured to directly accept both AC and DC power, though such is not required. In exemplary embodiments, the display units 52, 62, 72, 82 may be configured to directly accept DC power generated by the solar energy harvesting devices 54, 64, 74, 84, and the display units 52, 62, 72, 82 may be configured to directly accept AC power generated by the electrical grid 100.

Figure 20:
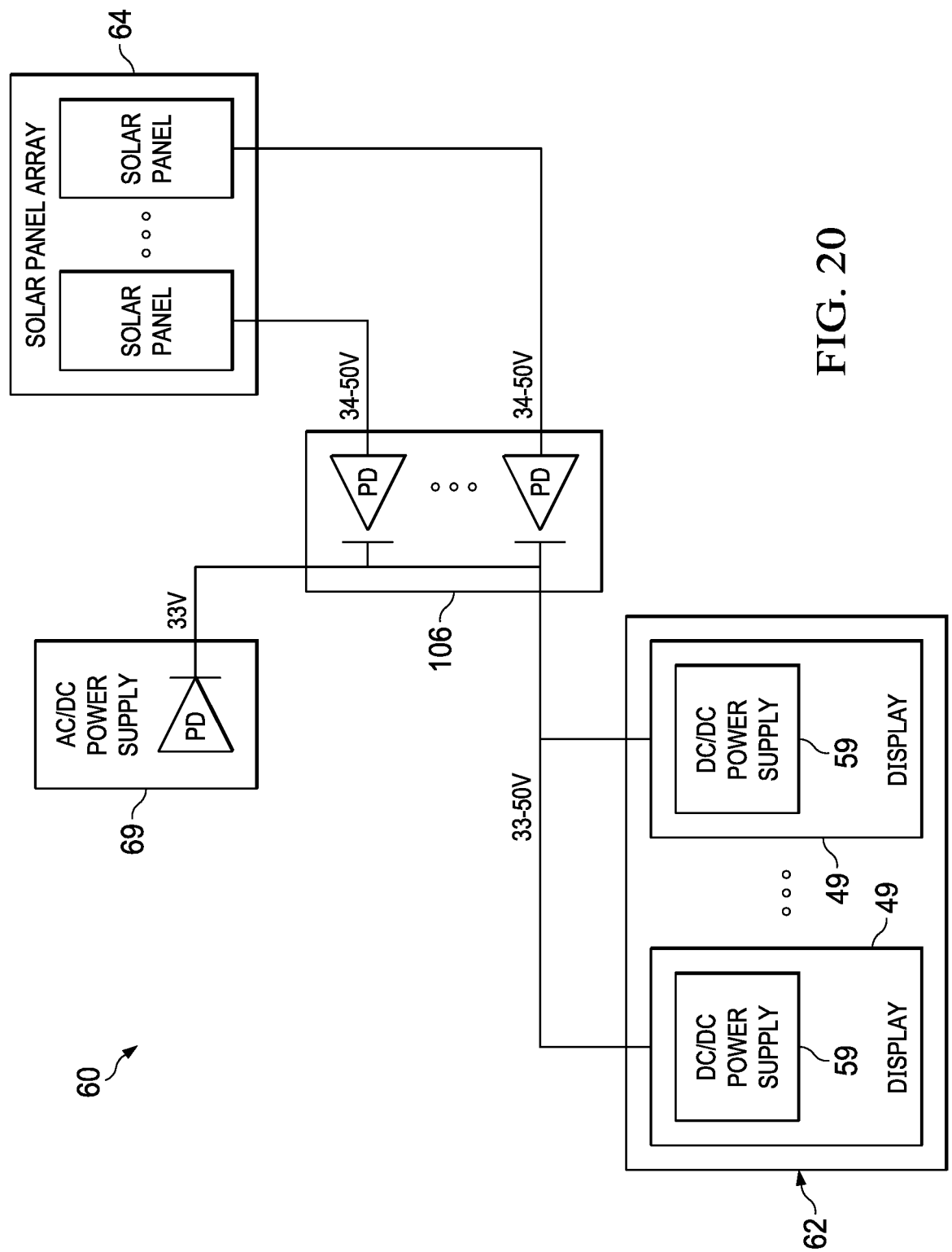
FIG. 20 is a simplified electrical schematic diagram in accordance with the present invention.

FIG. 20 illustrates a schematic illustration of an exemplary embodiment of an assembly 60. The assembly 60 may comprise a solar panel array 64 having two or more solar panels. The assembly 60 may comprise two or more electronic displays 49. The assembly 60 may comprise a DC/DC power supply 59 for each electronic display 49. The assembly 50 may comprise an AC/DC power supply 69. A controller 106 may be placed in electronic communication with the AC/DC power supply 69, the solar panel array 64, and the display unit 62. The AC/DC power supply 69 in exemplary embodiments, without limitation, may comprise the electrical grid 100. In operation, the solar panel array may supply power to the controller 106 (e.g., 34-50 volts) via a perfect diode (or an ideal diode). The controller 106 may then direct this power to the AC/DC power supply (e.g., 33 volts) via another perfect diode, and/or also to the DC/DC power supplies within the displays (e.g., 33-50 volts).

While certain references are made herein with regards to the assembly 60 and display unit 62, the same or similar arrangement may be utilized with regard to the various assemblies 50, 60, 70, 80 and related components.

Figure 21:
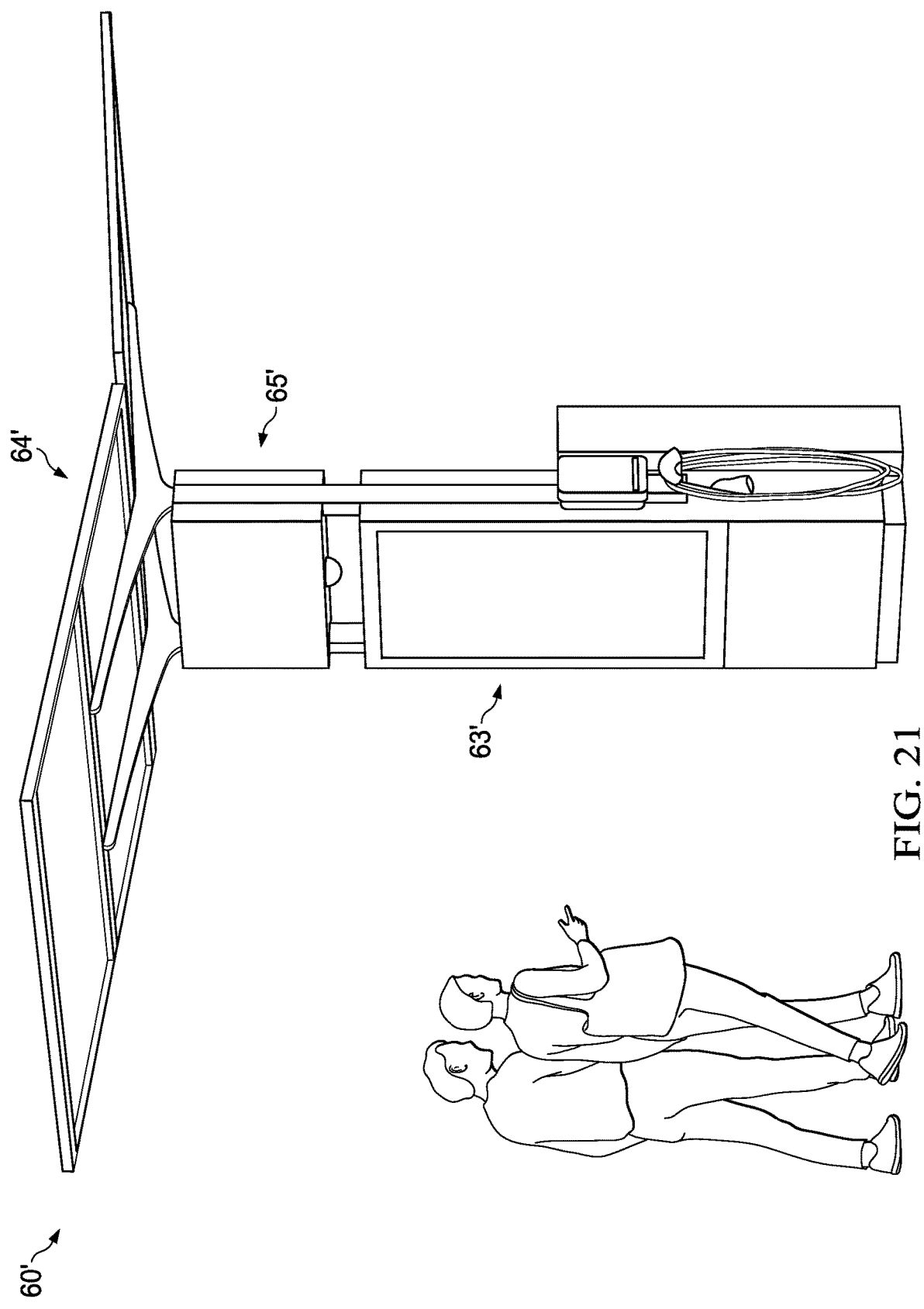
FIG. 21 is a perspective view of another exemplary surface mounted assembly with solar energy harvesting devices.

FIG. 21 illustrates another exemplary surface mounted assembly 60'. The surface mounted assembly 60' may be similar to, and/or may comprise some or all of the same components as the surface mounted assembly 60. The surface mounted assembly 60' may comprise one or more solar energy harvesting devices 64'. The solar energy harvesting devices 64' may be the same, or similar to, the solar energy harvesting devices 64 previously shown and/or described herein. In exemplary embodiments, the solar energy harvesting devices 64' may comprise multiple solar panels mounted at an angle to one another, such as but not limited forming a "V" shape. The surface mounted assembly 60' may comprise an upper portion 65' which may be the same or similar to the upper portion 65, though such is not required. The surface mounted assembly 60' may comprise a display layer portion 63' which may be the same or similar to the display layer portion 63, though such is not required.

Figure 22:
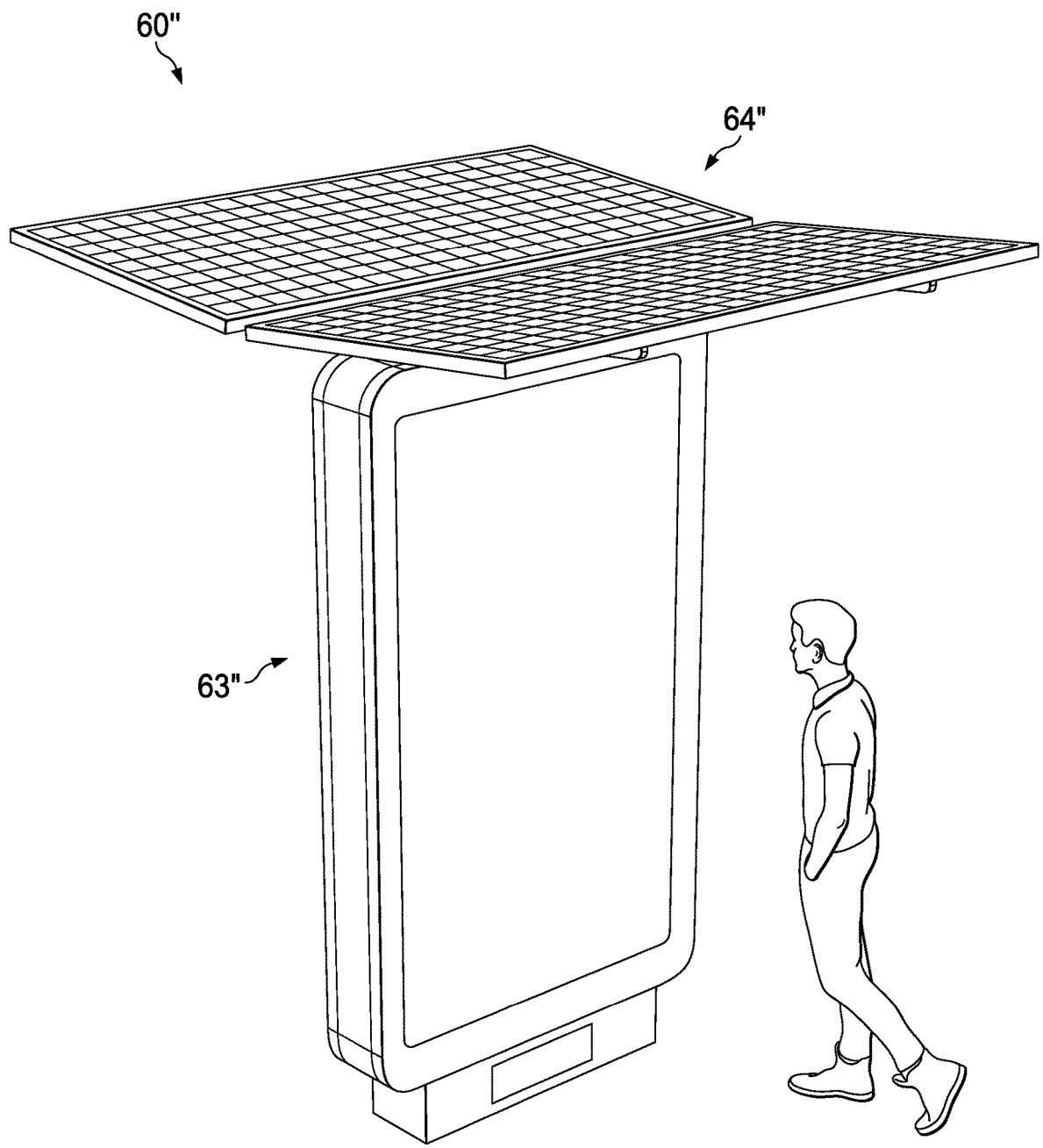
FIG. 22 is a top perspective view of another exemplary surface mounted assembly with solar energy harvesting devices.

FIG. 22 illustrates another exemplary surface mounted assembly 60". The surface mounted assembly 60" may be similar to, and/or may comprise some or all of the same components as the surface mounted assembly 60 and/or 60'. The surface mounted assembly 60" may comprise one or more solar energy harvesting devices 64". The solar energy harvesting devices 64" may be the same, or similar to, the solar energy harvesting devices 64 and/or 64' previously shown and/or described herein. In exemplary embodiments, the solar energy harvesting devices 64" may comprise multiple solar panels mounted at an angle to one another, such as but not limited, forming a "V" shape. The surface mounted assembly 60" may comprise a display layer portion 63" which may be the same or similar to the display layer portion 63, though such is not required.

Figure 23:
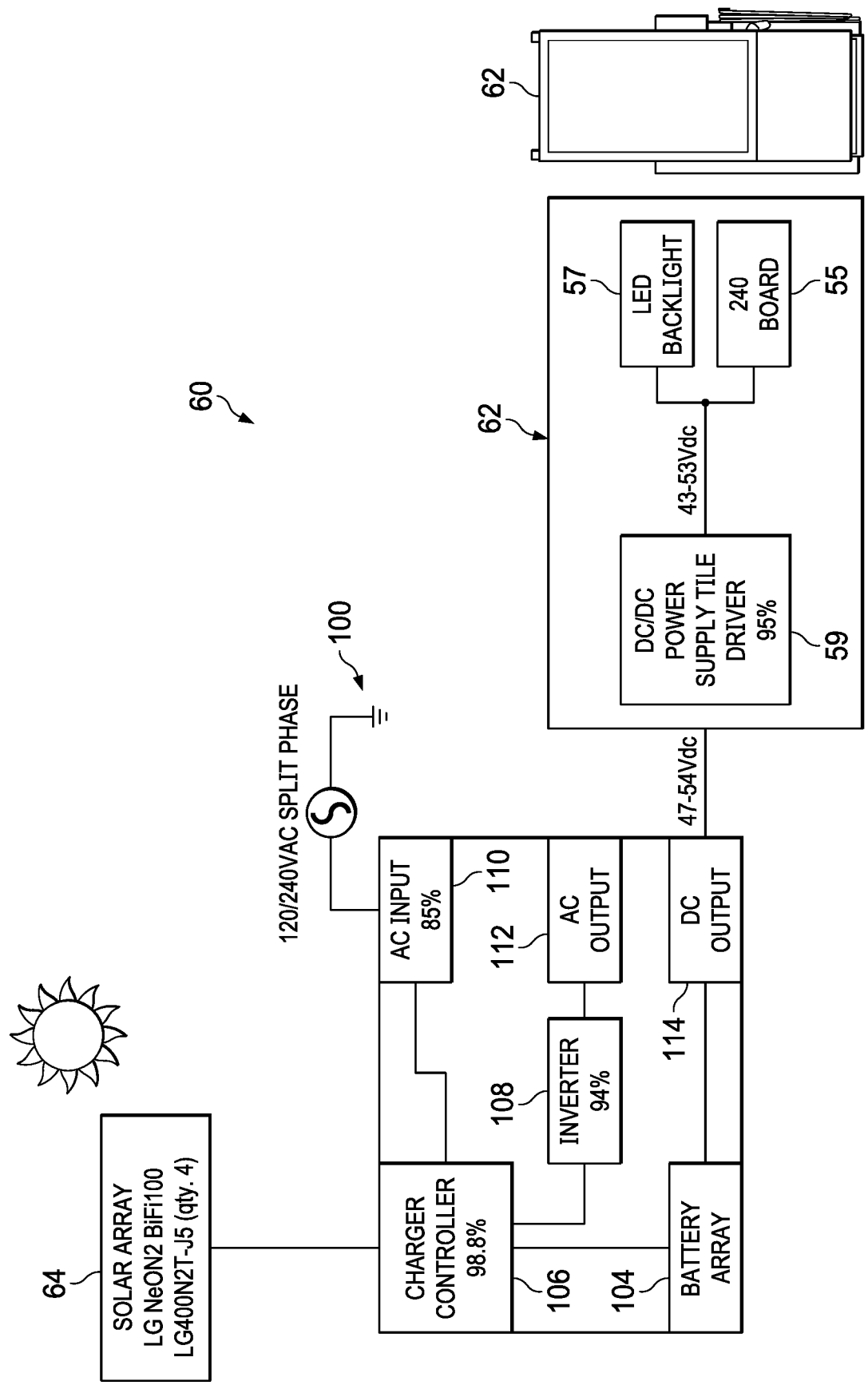
FIG. 23 is an exemplary electrical schematic diagram for use with the systems and methods of FIGS. 1-22.

FIG. 23 is an exemplary electrical schematic. The solar energy harvesting devices 64 may be placed in electrical connection with the controller 106. The controller 106 may be in electrical connection with the utility power supply 100, such as but not limited to, by way of an AC input 110. An inverter 108 may be electrically interposed between the AC input 110 and an AC output 112 to convert AC power to DC power as required. The controller 106 maybe electrically connected to one or more energy storage devices 104 for storing excess energy and disbursing such excess energy as instructed by the controller 106. The energy storage devices 104 may be in electrical connection with an DC output 114.

The DC output 114 may be placed in electrical connection with one or more display units 62. The DC power may be received at a DC/DC power supply 59. The DC/DC power supply 59 may distribute DC power to backlights 57 and/or various electrical components 55 of the display unit 62, the display layer portion 63, and/or other various components of the assembly 60 such as but not limited to sensors, fans, cooling device, customer equipment, electronics, combination thereof, or the like.

While certain references are made herein with regards to the assembly 60 and display unit 62, the same or similar arrangement may be utilized with regard to the various assemblies 50, 60, 60', 60", 70, 80 and related components.

Exemplary electrical efficiencies are provided at FIG. 23 by way of non-limiting example to demonstrate the increase in efficiency realized by utilizing a DC/DC system. Such efficiencies may be based on simulated weather conditions based on historical weather and other environmental considerations for a given location.

Figure 24:
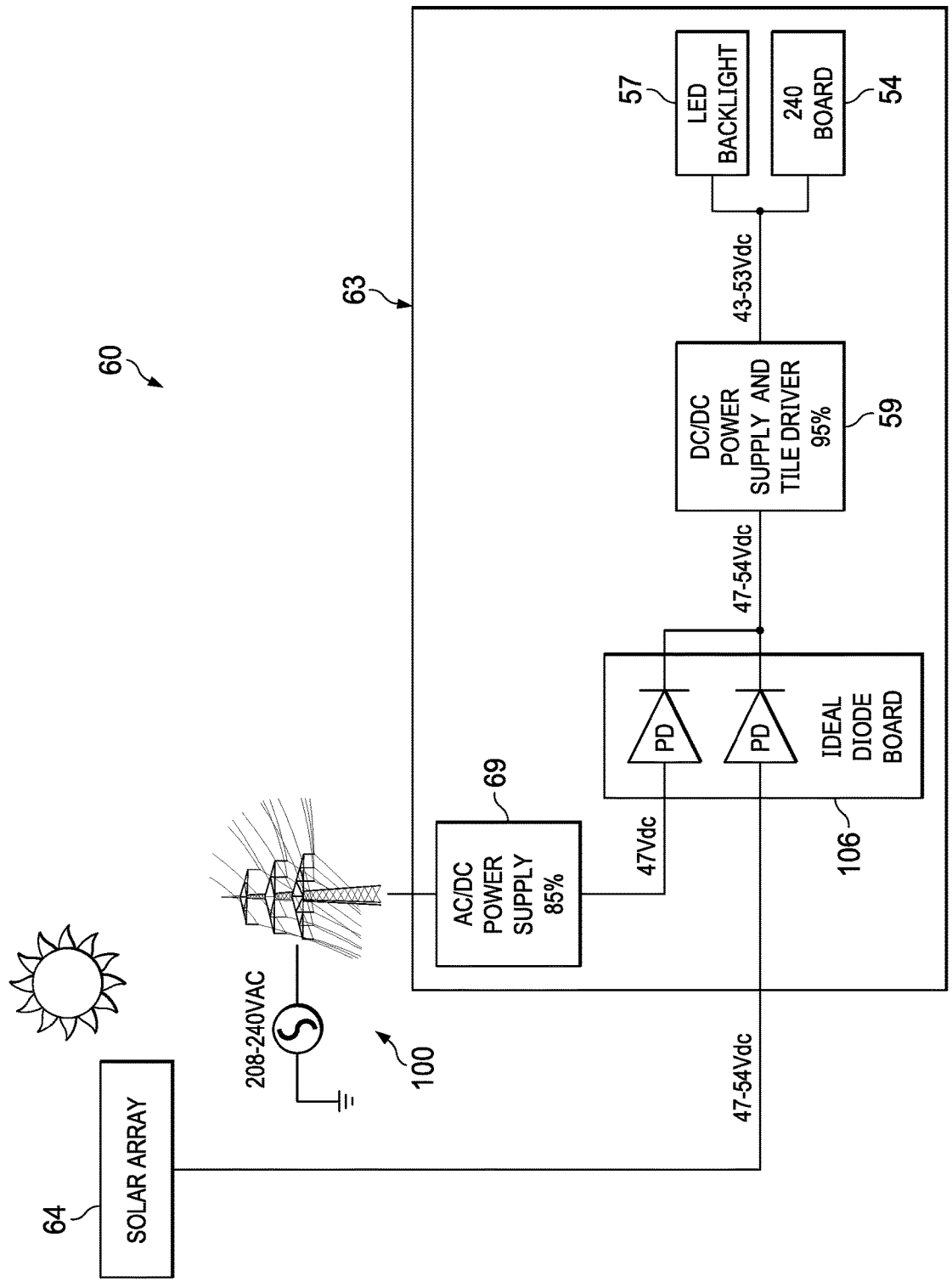
FIG. 24 is another exemplary electrical schematic diagram for use with the systems and methods of FIGS. 1-22.

FIG. 24 is another exemplary electrical schematic. The solar energy harvesting devices 64 may be placed in electrical connection with the controller 106. The controller 106 may be in electrical connection with the utility power supply 100, such as but not limited to, by way of an AC/DC power supply 69. The AC/DC power supply 69, in exemplary embodiments, may comprise one or more inverters 108 for converting AC energy from the utility power supply 100 to DC power as required. The controller 106 maybe electrically connected to a DC/DC power supply 59. The DC/DC power supply 59 may distribute DC power to backlights 57 and/or various electrical components 55 of the display layer portion 63 and/or other various components of the assembly 60 such as but not limited to the display unit 62, sensors, fans, cooling device, customer equipment, electronics, combination thereof, or the like.

While certain references are made herein with regards to the assembly 60 and display layer portion 63, the same or similar arrangement may be utilized with regard to the various assemblies 50, 60, 60', 60", 70, 80 and related components.

Exemplary electrical efficiencies are provided at FIG. 24 by way of non-limiting example to demonstrate the increase in efficiency realized by utilizing a DC/DC system. Such efficiencies may be based on simulated weather conditions based on historical weather and other environmental considerations for a given location.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing devices. The electronic devices may be personal computers, smartphones, tablets, databases, servers, or the like. The electronic connections described herein may be accomplished by wired or wireless means.

What is claimed is:

1. A solar powered display assembly comprising:
    a display unit comprising at least one electronic display, wherein said display unit is configured for electrical connection to an electrical grid;
    a housing for said display unit;
    a solar energy harvesting device electrically connected to said display unit; and
    at least one structural member extending between said housing and said solar energy harvesting device such that a bottom surface of said solar energy harvesting device is elevated above, and spaced apart from, a top surface of said housing, wherein said solar energy harvesting device has a first footprint, said housing has a second footprint which is smaller than said first footprint such that shade is at least periodically cast on the display unit during daylight hours.

2. The solar powered display assembly of claim 1 wherein:
    said solar energy harvesting device is configured to produce direct current ("DC") power;
    said display unit is configured to accept power from the solar energy harvesting device in DC form; and
    said display unit is configured to accept power from the electrical grid in alternating current form.

3. The solar powered display assembly of claim 1 wherein:
    said solar energy harvesting device is positioned directly above said housing such that said first footprint completely overlies said second footprint.

4. The solar powered display assembly of claim 3 wherein:
    said solar energy harvesting device has a minimum width dimension which is larger than a maximum width dimension for said housing.

5. The solar powered display assembly of claim 4 wherein:
    said solar energy harvesting device has a minimum depth dimension which is larger than a maximum depth dimension for said housing.

6. The solar powered display assembly of claim 1 further comprising:
    an open loop pathway for ambient air through said housing.

7. The solar powered display assembly of claim 6 further comprising:
    a closed loop pathway for circulating gas within said housing; and
    a heat exchanger, wherein said open loop pathway includes a first portion of said heat exchanger, and wherein said closed loop pathway includes a second portion of said heat exchanger.

8. The solar powered display assembly of claim 2 further comprising:
    a controller electrically interposed between said electrical grid, said solar energy harvesting device, and said display unit, wherein said controller comprises one or more processors and one or more electronic storage devices comprising executable software instructions, which when executed by said one or more processors, configures said one or more processors to:
        determine an amount of power required for operations of the display unit;
        at least partially power the display unit with DC power generated by the solar energy harvesting device where such DC power generated by the solar energy harvesting device is available for use; and
        where the DC power generated by the solar energy harvesting devices available for use is less than the amount of power required to operate the display unit, draw only an additional amount of AC power required to reach the amount of power required for operations of the display unit from the electrical grid.

9. The solar powered display assembly of claim 1 wherein:
    said at least one structural member comprises a bus shelter structure having a first and second side and a roof;
    said display unit is mounted to one of said first and second sides; and
    said solar energy harvesting device is mounted to, or forms at least a portion of, the roof.

10. The solar powered display assembly of claim 1 wherein:
    said at least one structural member comprises a pole; and
    said solar energy harvesting device is mounted at an angle relative to a longitudinal axis of said pole.

11. The solar powered display assembly of claim 10 wherein:
    said display unit is mounted flush to said pole.

12. The solar powered display assembly of claim 10 wherein:
    said display unit is mounted to said pole in a flag orientation.

13. The solar powered display assembly of claim 1 wherein:
    said at least one structural member comprises:
        a vertical member; and
        a canopy extending horizontally from said vertical member;
    said display unit is mounted to said vertical member; and
    said solar energy harvesting device is mounted to, and forms at least a portion of, said canopy.

14. The solar powered display assembly of claim 1 wherein:
    said housing is configured for direct or indirect mounting to a ground surface; and
    said solar energy harvesting device comprises a plurality of solar panels provided in a fanned arrangement.

15. A method for providing solar power to a display assembly, said method comprising:
    securing a solar panel at an elevated position above, and spaced part from, a housing comprising a display unit comprising at least one electronic display;

electrically connecting said solar panel to said display unit;
exposing said solar panel to ambient light;
determining an amount of power required to operate the display unit within predetermined parameters;
determining an amount of power available from said solar panel;
determining a difference in the amount of power required to operate the display and the amount of power available from said solar panel;
supplying the amount of power available from said solar panel to said display unit; and
supplying the difference in the amount of power from an electrical grid;
wherein said solar panel has a first footprint which is larger than a second footprint of said housing.

16. The method of claim 15 further comprising:
mounting said housing to a pole attached to a ground surface; and
mounting said solar panel to said pole at a vertical position spaced apart from and above said display unit.

17. The method of claim 15 further comprising:
mounting said housing to a vertical member; and
mounting said solar panel to a canopy extending horizontally from said vertical member.

18. The method of claim 15 further comprising:
mounting said housing to bus shelter; and
mounting said solar panel to a roof of said bus shelter.

19. The method of claim 15 wherein:
the solar panel is configured to provide direct current power; and
the electrical grid is configured to provide alternating current power.

20. A system for providing solar power to a display assembly, said system comprising:
a display unit comprising an electronic display, wherein said display unit is electrically connected to an electrical grid supplying alternating current ("AC") power;
a housing for said display unit;
a solar energy harvesting device electrically connected to said display unit and configured to provide direct current ("DC") power;
at least one structural member extending between said housing and said solar energy harvesting device such that a bottom surface of said solar energy harvesting device is elevated above, and spaced apart from, a top surface of said housing;
an airflow pathway extending through said housing and configured to receive ambient air;
a fan located along said airflow pathway and configured to force said ambient air through said airflow pathway when activated; and
a controller interposed between said power source, said solar energy harvesting device, said fan, and said display unit, wherein said controller comprises one or more processors and one or more electronic storage devices comprising executable software instructions, which when executed by said one or more processors, configures said one or more processors to:
determine an amount of power required to operate the display assembly within customer defined parameters;
determine an amount of DC power available from said solar panel;
determine a difference in the amount of power required to operate the display assembly within said customer defined parameters and the amount of DC power available from said solar panel;
supply the amount of DC power available from said solar panel to said display unit as DC power; and
supply the difference in the amount of power as AC power from the electrical grid to said display unit as AC power;
wherein said solar energy harvesting device defines a minimum depth dimension which is larger than a maximum depth dimension for said housing;
wherein said solar energy harvesting device defines a minimum width dimension which is larger than a maximum width dimension for said housing.

21. A solar powered display assembly comprising:
a structural framework configured for attachment to a ground surface;
a display unit comprising at least one electronic display secured to said structural framework at a position elevated above said ground surface and below an upper portion of said structural framework; and
a solar energy harvesting device connected to said upper portion of said structure framework such that said solar energy harvesting device is located above, and spaced apart from, said display unit, wherein said solar energy harvesting device is electrically connected to said display unit;
wherein said solar energy harvesting device has a first footprint, said housing has a second footprint which is smaller than said first footprint.

22. The solar powered display assembly of claim 21 wherein:
said solar energy harvesting device comprises a first panel area and a second panel area, wherein said first and second panel areas are positioned adjacent to one another in a manner forming an obtuse angle between upper surfaces of said first and second panel areas.

23. The solar powered display assembly of claim 22 further comprising:
a storage area located within said structural framework below said display unit.

24. The solar powered display assembly of claim 23 wherein:
said display unit is configured for electrical connection to an electrical grid.

25. The solar powered display assembly of claim 24 further comprising:
one or more electronic components for controlling power supplied to said display unit from said electrical grid and said solar energy harvesting device located within said storage area; and
one or more electronic components for operating the display unit located within said storage area.

26. The solar powered display assembly of claim 25 wherein:
said solar energy harvesting device is configured to produce direct current ("DC") power;
said display unit is configured to accept power from the solar energy harvesting device in DC power form; and
said display unit is configured to accept power from the electrical grid in alternating current form.

* * * * *